United States Patent
Shin et al.

(10) Patent No.: US 12,426,455 B2
(45) Date of Patent: Sep. 23, 2025

(54) DISPLAY PANEL AND DISPLAY DEVICE INCLUDING THE SAME

(71) Applicant: Samsung Display Co., Ltd., Yongin-Si (KR)

(72) Inventors: Dong Hee Shin, Asan-si (KR); Sunkwun Son, Suwon-si (KR); Nahyeon Cha, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 438 days.

(21) Appl. No.: 17/242,779

(22) Filed: Apr. 28, 2021

(65) Prior Publication Data

US 2022/0045156 A1 Feb. 10, 2022

(30) Foreign Application Priority Data

Aug. 10, 2020 (KR) .................. 10-2020-0099972

(51) Int. Cl.
*H10K 59/131* (2023.01)
*H01L 23/00* (2006.01)
*H01L 25/065* (2023.01)

(52) U.S. Cl.
CPC ....... *H10K 59/131* (2023.02); *H01L 25/0655* (2013.01); *H01L 24/32* (2013.01); *H01L 2224/32137* (2013.01)

(58) Field of Classification Search
CPC .................. H10K 59/131; H01L 25/0655
See application file for complete search history.

(56) References Cited

U.S. PATENT DOCUMENTS

| | | | |
|---|---|---|---|
| 2013/0033471 A1* | 2/2013 | Park | G09G 3/20 345/207 |
| 2014/0028534 A1* | 1/2014 | Park | G09G 3/20 345/84 |
| 2015/0227172 A1* | 8/2015 | Namkung | H10K 59/40 345/173 |
| 2016/0240603 A1 | 8/2016 | Park et al. | |
| 2017/0053949 A1* | 2/2017 | Shin | G02F 1/133345 |
| 2017/0083273 A1 | 3/2017 | Kim et al. | |
| 2017/0102578 A1* | 4/2017 | Shin | H10D 30/6723 |

(Continued)

FOREIGN PATENT DOCUMENTS

| | | |
|---|---|---|
| JP | H11015014 A | 1/1999 |
| KR | 100146212 B1 | 5/1998 |

(Continued)

*Primary Examiner* — Vongsavanh Sengdara
(74) *Attorney, Agent, or Firm* — CANTOR COLBURN LLP

(57) ABSTRACT

A display panel includes a first sub-display panel, a second sub-display panel adjacent to the first sub-display panel in a first direction, and a connection member electrically connecting the first sub-display panel to the second sub-display panel. The first sub-display panel includes a first pixel, a second pixel between and adjacent to the first pixel and the second sub-display panel, a first low power voltage line for transferring a power voltage to the first pixel, and a first gate line electrically connected to the first pixel and the second pixel, the second pixel receives the power voltage from the first low power voltage line, the second sub-display panel includes a third pixel adjacent to the first sub-display panel, and the third pixel is electrically connected to the first gate line.

28 Claims, 23 Drawing Sheets

(56) References Cited

U.S. PATENT DOCUMENTS

| | | | | |
|---|---|---|---|---|
| 2017/0357114 A1* | 12/2017 | Kim | ................. | G02F 1/13394 |
| 2018/0366529 A1* | 12/2018 | Lee | ................. | H10K 59/1213 |
| 2021/0020732 A1* | 1/2021 | Watanabe | ............... | G09F 9/30 |

FOREIGN PATENT DOCUMENTS

| | | |
|---|---|---|
| KR | 1020000021827 A | 4/2000 |
| KR | 100529559 B1 | 2/2006 |
| KR | 20160100012 A | 8/2016 |
| KR | 1020160099999 A | 8/2016 |
| KR | 20170034207 A | 3/2017 |

* cited by examiner

FIG. 3
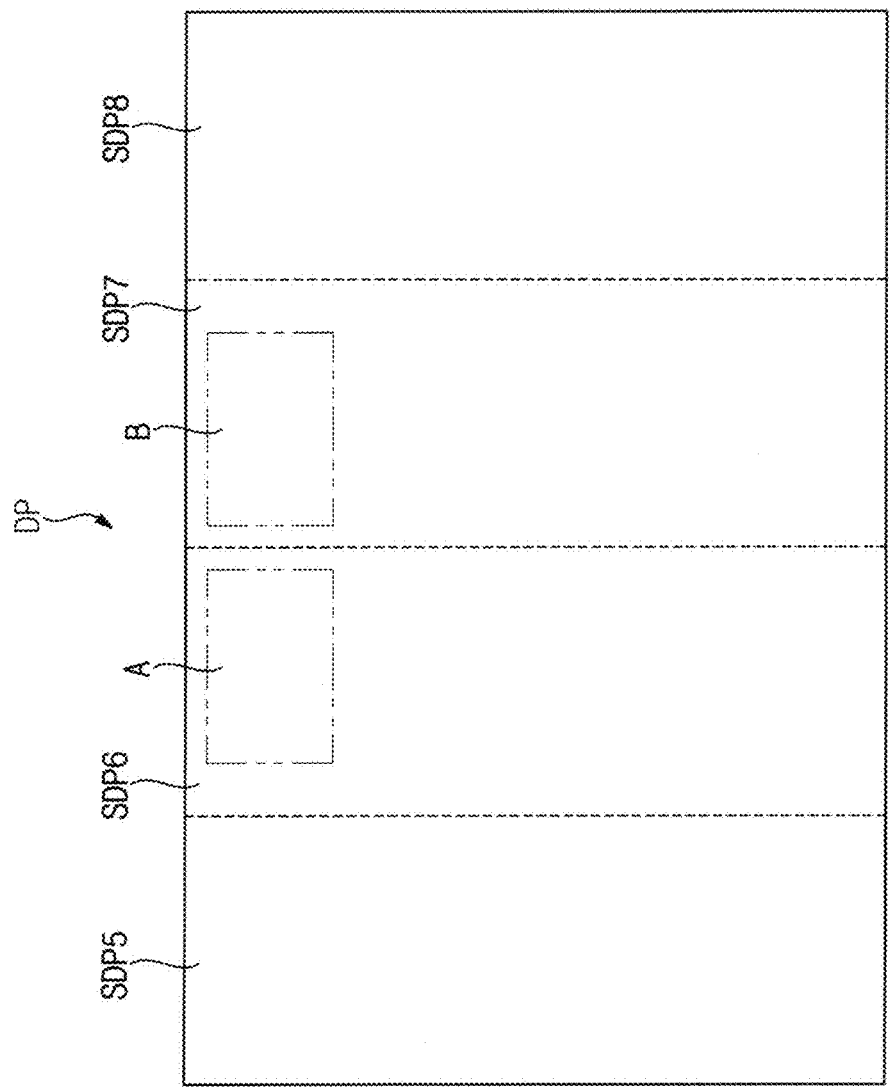
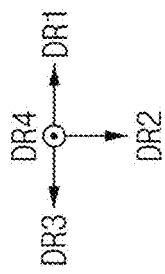

DISPLAY PANEL AND DISPLAY DEVICE INCLUDING THE SAME

This application claims priority to Korean Patent Application No. 10-2020-0099972, filed on Aug. 10, 2020, and all the benefits accruing therefrom under 35 U.S.C. § 119, the content of which in its entirety is herein incorporated by reference.

BACKGROUND

1. Field

The present invention relates to a display panel and a display device including the same. More specifically, the present invention relates to a display panel to which a power supply voltage is applied, and a display device including the same.

2. Description of the Related Art

A display device has been increasingly spotlighted. Accordingly, the display device is produced as various types of display devices such as organic light emitting diodes, liquid crystal displays, and quantum-dot nano light emitting diodes.

In addition, researches have been conducted to increase the size of the display device. The large-sized display device may include a plurality of display panels. For example, the display device may include a tiled display device that couples a plurality of display panels to form a single display device.

The tiled display device may use a connection member having conductivity to couple the display panels. However, a distance between pixels disposed adjacent to a connection area of the display panels may increase. Accordingly, the connection area (for example, a seam-line) may be visually recognized from the outside.

SUMMARY

The technical problem of the conventional tiled display device is disclosed based on the above aspect. An aspect of the present invention is to provide a display panel having improved display quality.

An aspect of the present invention is to provide a display device including the display panel.

However, the problem to be solved by the present invention is not limited to the above-mentioned problem, and may be variously expanded without departing from the spirit and scope of the present invention.

According to embodiments, there is provided a display panel including a first sub-display panel, a second sub-display panel adjacent to the first sub-display panel in a first direction, and a connection member electrically connecting the first sub-display panel to the second sub-display panel. The first sub-display panel includes a first pixel, a second pixel between and adjacent to the first pixel and the second sub-display panel, a first low power voltage line for transferring a power voltage to the first pixel and a first gate line electrically connected to the first pixel and the second pixel, the second pixel receives the power voltage from the first low power voltage line, the second sub-display panel includes a third pixel adjacent to the first sub-display panel, and the third pixel is electrically connected to the first gate line.

In embodiments, the first sub-display panel may further include a low power voltage transfer line, and the low power voltage transfer line may be electrically connected to the first low power voltage line through a contact hole.

In embodiments, the low power voltage transfer line and the first low power voltage line may be perpendicular to each other.

In embodiments, the second pixel may receive the power voltage through the low power voltage transfer line.

In embodiments, the first pixel may further include a plurality of low power voltage connection lines, and each of the low power voltage connection lines may be electrically connected to the low power voltage transfer line through a contact hole.

In embodiments, the low power voltage connection lines may be electrically connected to a cathode electrode of a light emitting device.

In embodiments, the second sub-display panel may further include a fourth pixel adjacent to the third pixel and spaced apart from the first sub-display panel with the third pixel therebetween, a second low power voltage line for applying the power voltage to the fourth pixel, and a second gate line electrically connected to the first gate line, the third pixel, and the fourth pixel.

In embodiments, the second sub-display panel may further include a low power voltage transfer line, the low power voltage transfer line may be electrically connected to the second low power voltage line through a contact hole, and the third pixel may receive the power voltage through the low power voltage transfer line.

In embodiments, the low power voltage transfer line and the second low power voltage line may be perpendicular to each other.

In embodiments, the second pixel may further include a plurality of low power voltage connection lines, and each of the low power voltage connection lines may be electrically connected to the low power voltage transfer line through a contact hole.

In embodiments, the low power voltage connection lines may be electrically connected to a cathode electrode of a light emitting device.

In embodiments, the first sub-display panel may further include a first connection pad disposed between and adjacent to the second pixel and the second sub-display panel, and the second sub-display panel may further include a second connection pad disposed between and adjacent to the third pixel and the first sub-display panel.

In embodiments, the first connection pad and the second connection pad may contact with the connection member.

In embodiments, the first connection pad may be electrically connected to the first gate line, and the second connection pad may be electrically connected to a second gate line electrically connected to the third pixel.

In embodiments, the first connection pad may include a conductive layer electrically connected to the first gate line, and the conductive layer may have a thickness thicker than a thickness of the first gate line in a thickness direction.

In embodiments, the first connection pad may further include a via-insulating layer, and the via-insulating layer may have a thickness thicker than the thickness of the conductive layer.

In embodiments, the second connection pad may include a conductive layer electrically connected to the second gate line, and the conductive layer may have a thickness thicker than a thickness of the second gate line in the thickness direction.

In embodiments, the second connection pad may further include a via-insulating layer, and the via-insulating layer may have a thickness thicker than the thickness of the conductive layer.

In embodiments, the connection member may include a conductive material.

In embodiments, the connection member may include an anisotropic conductive film.

According to embodiments, there is provided a display device including a gate driver, and a display panel disposed on one side of the gate driver and electrically connected to the gate driver. The display panel may include a first sub-display panel, a second sub-display panel adjacent to the first sub-display panel in a first direction, and a connection member electrically connecting the first sub-display panel to the second sub-display panel, and the first sub-display panel may include a first pixel, a second pixel between and adjacent to the first pixel and the second sub-display panel, a first low power voltage line for transferring a power voltage to the first pixel, and a first gate line electrically connected to the gate driver, the first pixel, and the second pixel. The second pixel may receive the power voltage from the first low power voltage line, the second sub-display panel may include a third pixel adjacent to the first sub-display panel, and the third pixel may be electrically connected to the first gate line.

In embodiments, the first sub-display panel may further include a low power voltage transfer line, and the low power voltage transfer line may be electrically connected to the first low power voltage line through a contact hole.

In embodiments, the first pixel may further include a plurality of low power voltage connection lines, and each of the low power voltage connection lines may be electrically connected to the low power voltage transfer line through a contact hole.

In embodiments, the low power voltage connection lines may be electrically connected to a cathode electrode of a light emitting device.

In embodiments, the second sub-display panel may further include a fourth pixel adjacent to the third pixel and spaced apart from the first sub-display panel with the third pixel therebetween, a second low power voltage line for applying the power voltage to the fourth pixel, and a second gate line electrically connected to the first gate line, the third pixel, and the fourth pixel.

In embodiments, the second sub-display panel may further include a low power voltage transfer line, the low power voltage transfer line may be electrically connected to the second low power voltage line through a contact hole, and the third pixel may receive the power voltage through the low power voltage transfer line.

In embodiments, the second pixel may further include a plurality of low power voltage connection lines, and each of the low power voltage connection lines may be electrically connected to the low power voltage transfer line through a contact hole.

In embodiments, the low power voltage connection lines may be electrically connected to a cathode electrode of a light emitting device.

The display panel according to the embodiments of the present invention may include first and second sub-display panels. A connection member may be disposed to connect the first and second sub-display panels. The first sub-display panel may include a first pixel and a second pixel. The second pixel may not include a separate low power voltage line and may receive a power voltage from the first pixel. In addition, the second sub-display panel may include a third pixel and a fourth pixel. The third pixel may not include a separate power voltage line and may receive a power voltage from the fourth pixel. The third pixel may be disposed adjacent to the second pixel with the connection member therebetween.

Accordingly, since the low power voltage line is not required to be disposed in the second pixel and the third pixel, a space for an arrangement of a separate component can be additionally ensured. When the connection member and the connection pads are disposed in the space, a gap difference between the second pixel and the third pixel may not be large. Accordingly, the connection area (for example, a seam-line) due to the connection member and the connection pads cannot be visually recognized from the outside.

However, the advantageous effect of the present invention is not limited to the above effects, and may be variously expanded without departing from the spirit and scope of the present invention.

BRIEF DESCRIPTION OF THE DRAWINGS

Illustrative, non-limiting embodiments will be more clearly understood from the following detailed description in conjunction with the accompanying drawings.

FIGS. 2 and 3 are plan views schematically showing embodiments of the display device of FIG. 1.

DETAILED DESCRIPTION

Figure 1:
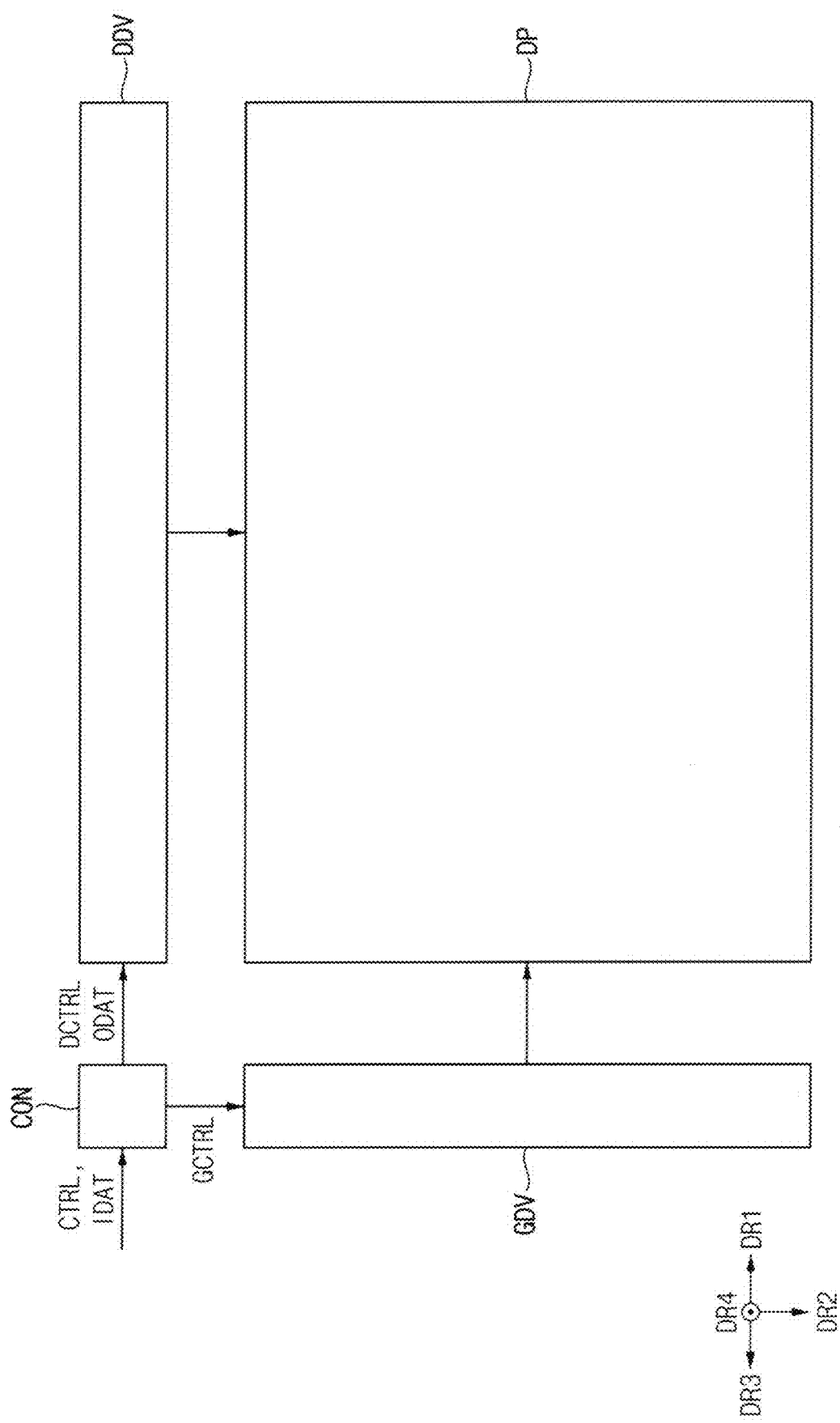
FIG. 1 is a block diagram showing a display device according to embodiments of the present invention.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein. The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will be understood that when an element is referred to as being "on" another element, it can be directly on the other element or intervening elements may be present therebetween. In contrast, when an element is referred to as being "directly on" another element, there are no intervening elements present. It will be understood that when an element is referred to as being "connected to" another element, it can be directly connected to the other element or intervening elements may be present therebetween. Hereinafter, the embodiments of the present invention will be described in detail with reference to the accompanying drawings. The same reference numerals are used for the same components in the drawings, and redundant descriptions of the same components will be omitted.

Figure 2:
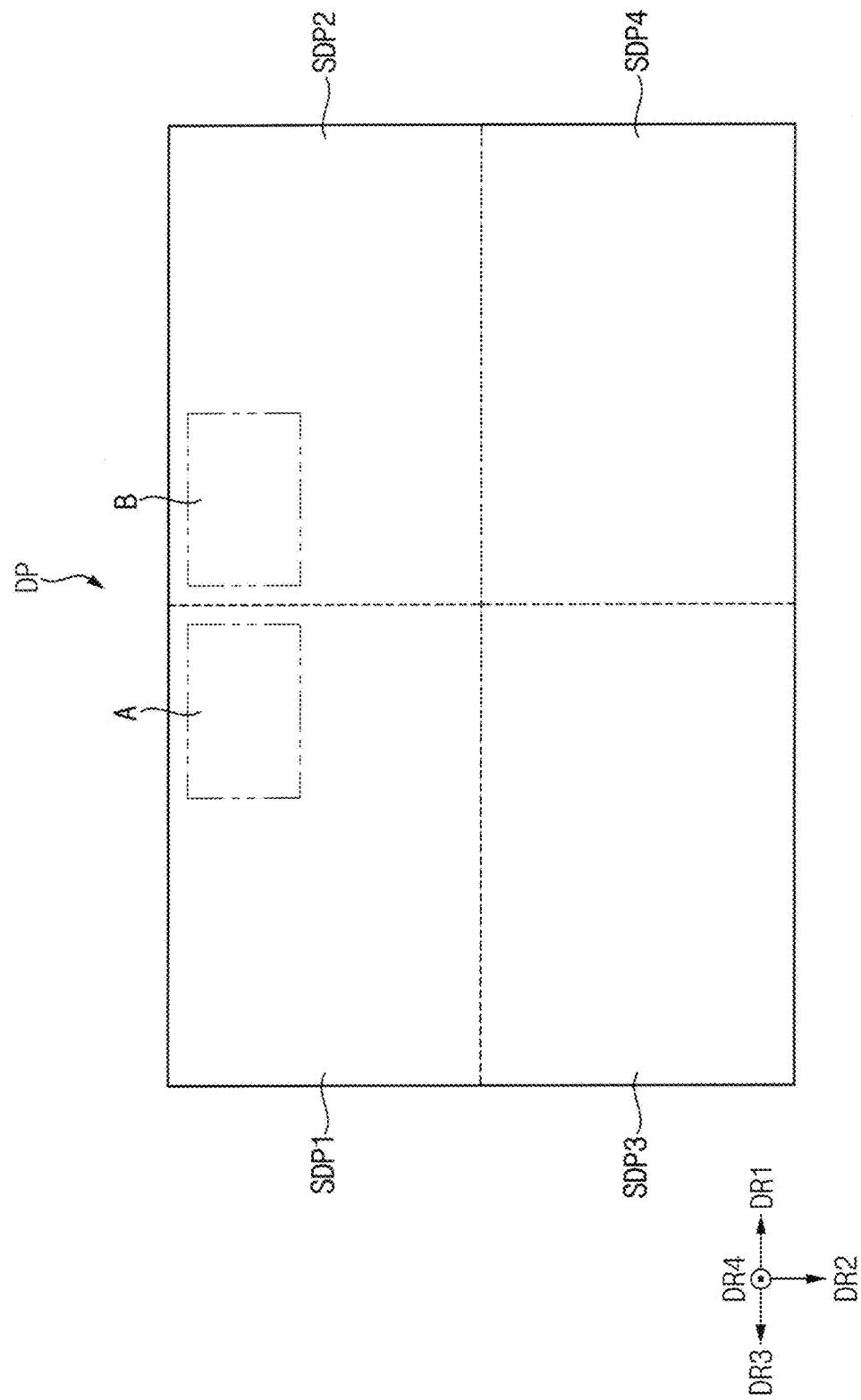

FIG. 1 is a block diagram showing a display device according to embodiments of the present invention. FIGS. 2 and 3 are plan views schematically showing embodiments of the display device of FIG. 1. In this application, the plan view is a view shown in the fourth direction DR4.

Referring to FIGS. 1 to 3, the display device may include a display panel DP, a data driver DDV, a gate driver GDV, and a timing controller CON.

In the embodiments, the display panel DP may include a plurality of sub-display panels. For example, as shown in FIG. 2, the display panel DP may include sub-display panels SDP1, SDP2, SDP3, and SDP4 arranged in a matrix form. In another embodiment, as shown in FIG. 3, the display panel DP may include sub-display panels SDP5, DP6, DP7, and DP8 coupled and arranged in the first direction DR1. FIGS. 2 and 3 show that the display panel DP includes four display panels, however, this is merely exemplary and the present invention is not limited thereto. In another embodiment, for example, the display panel DP may include N display panels (where, N is a natural number of 2 or more).

The display panel DP may include a plurality of pixel areas. Each of the pixel areas may include a pixel. The pixel may include a plurality of sub-pixels. The pixel may be connected to a light emitting structure. The display panel DP may display an image through the light emitting structure. For example, the light emitting structure may include an organic light emitting diode ("OLED"), a quantum-dot organic light emitting diode ("QDOLED"), a quantum-dot nano light emitting diode ("QNED"), and the like.

The timing controller CON may generate a gate control signal GCTRL, a data control signal DCTRL, and output image data ODAT, based on a control signal CTRL and input image data IDAT provided from the outside. For example, the control signal CTRL may include a vertical sync signal, a horizontal sync signal, an input data-enable signal, a master clock signal, or the like. For example, the input image data IDAT may be RGB data including red image data, green image data, and blue image data. Alternatively, the input image data IDAT may include magenta image data, cyan image data, and yellow image data.

The gate driver GDV may generate gate signals based on the gate control signal GCTRL provided from the timing controller CON. For example, the gate control signal GCTRL may include a vertical start signal, a clock signal, or the like.

The gate driver GDV may be electrically connected to the display panel DP, and sequentially output the gate signals. Each of the pixels may receive a data voltage according to the control of each of the gate signals.

The data driver DDV may generate the data voltage based on the data control signal DCTRL and the output image data ODAT provided from the timing controller CON. For example, the data control signal DCTRL may include an output data-enable signal, a horizontal start signal, a load signal, or the like.

The data driver DDV may be electrically connected to the display panel DP, and generate a plurality of data voltages. Each of the pixels may transmit a signal for luminance corresponding to each of the data voltages to the light emitting structure.

Figure 4:
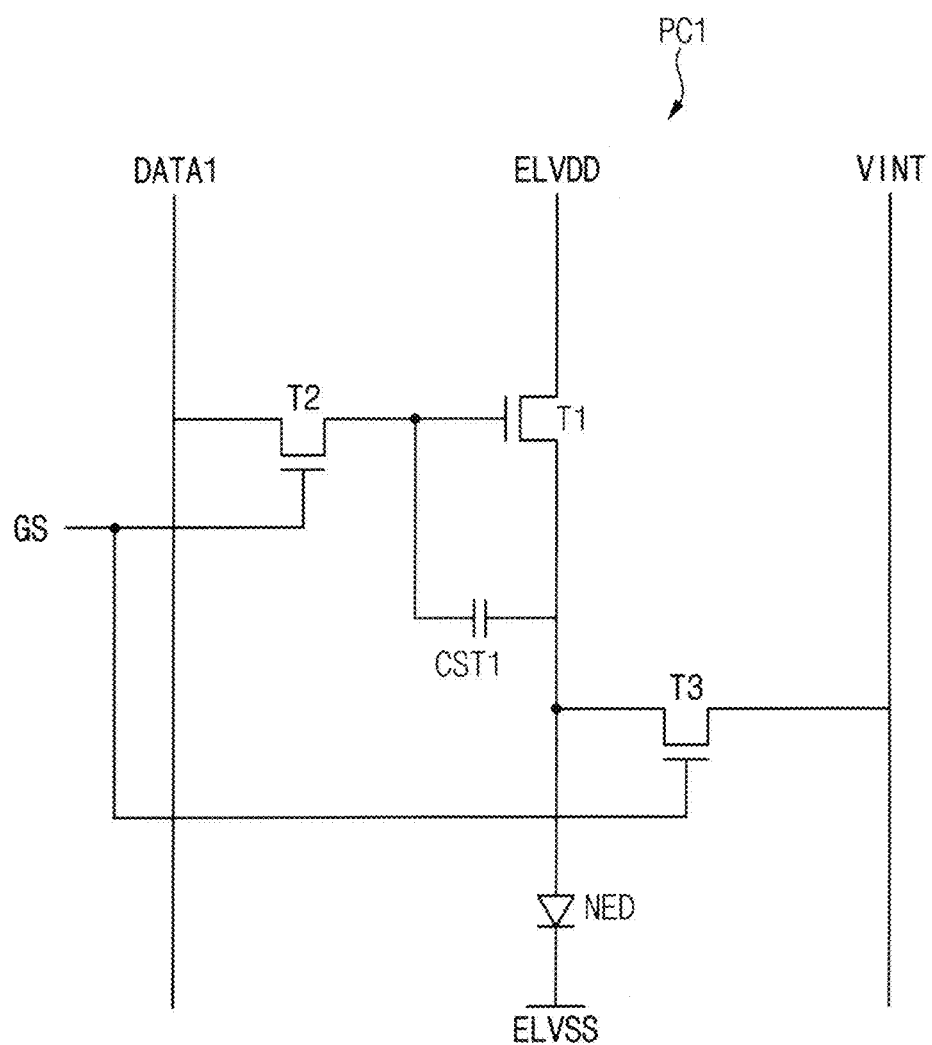
FIGS. 4 to 6 are circuit diagrams showing embodiments of a pixel circuit included in the display device of FIG. 1.
Figure 5:
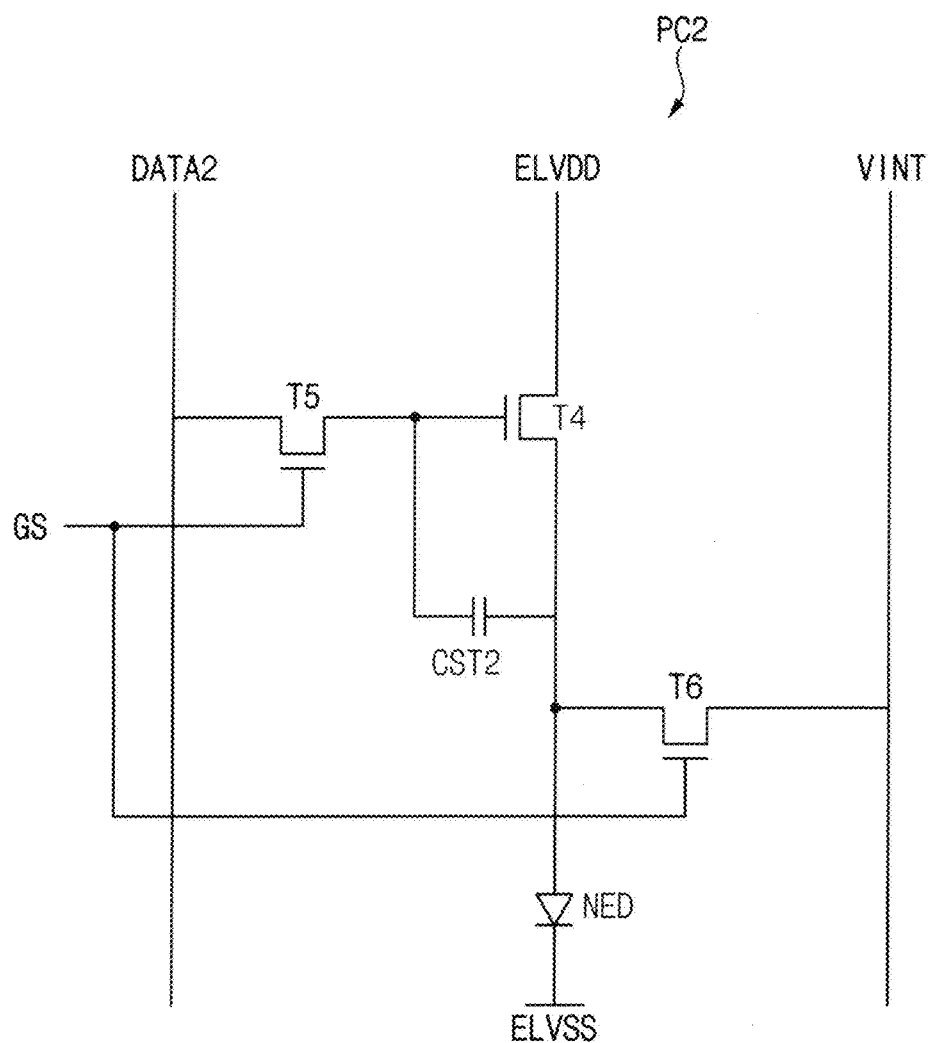
Figure 6:
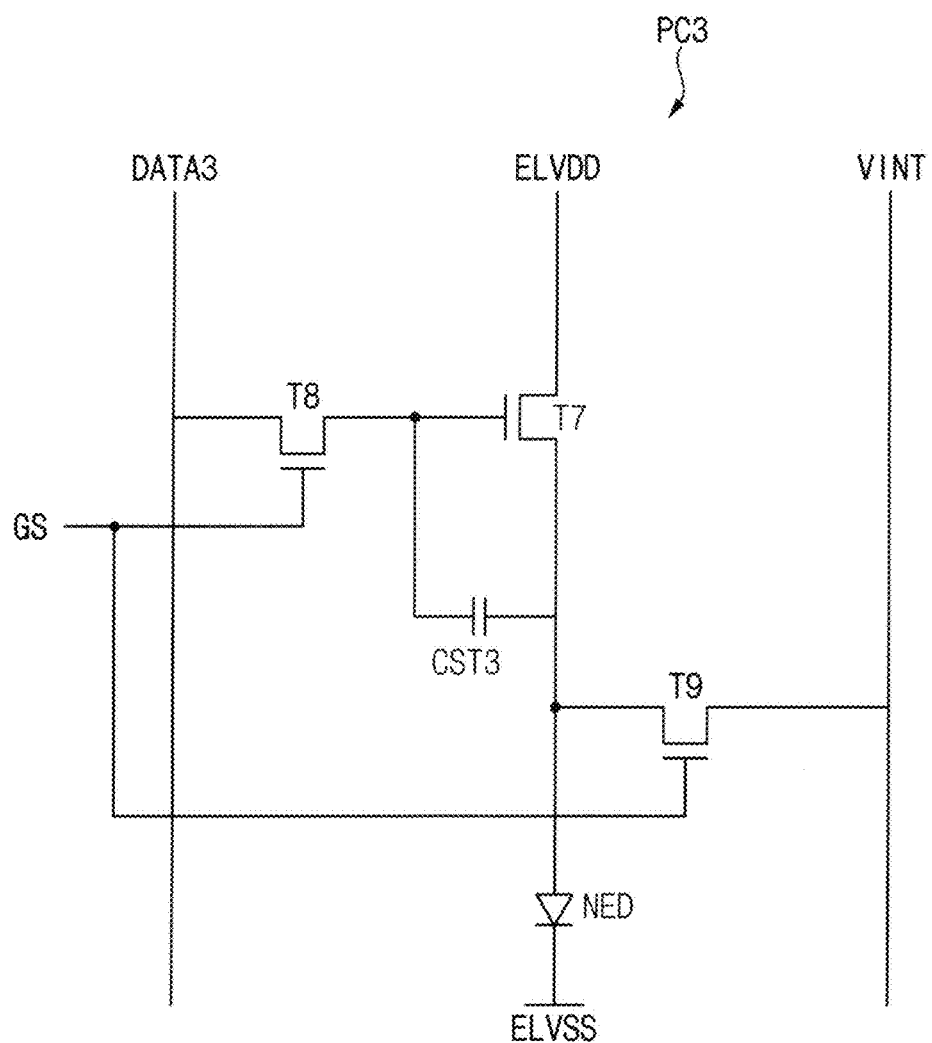
Figure 7:
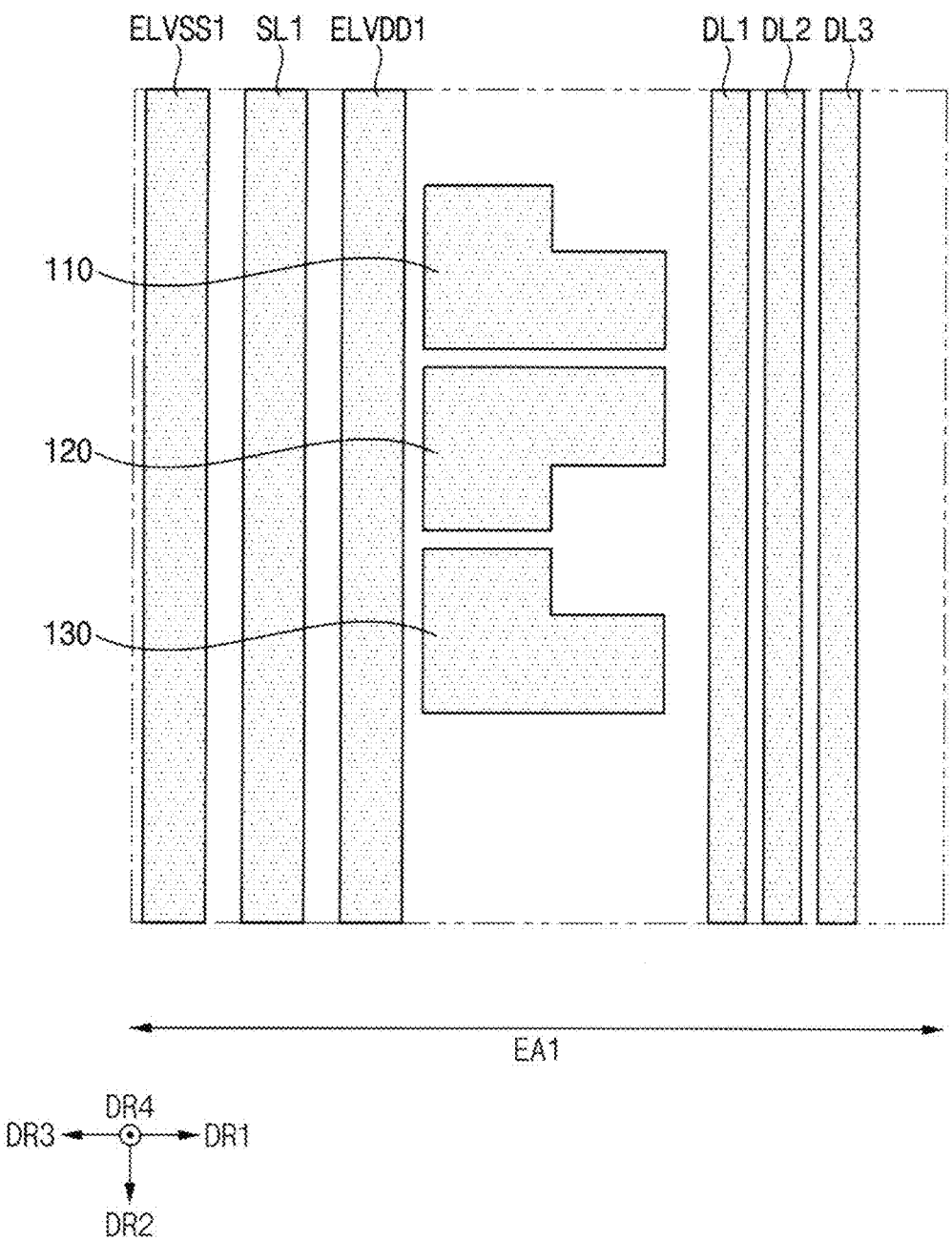
FIGS. 7 to 15 are layout diagrams showing a first pixel of the display device of FIG. 1.
Figure 8:
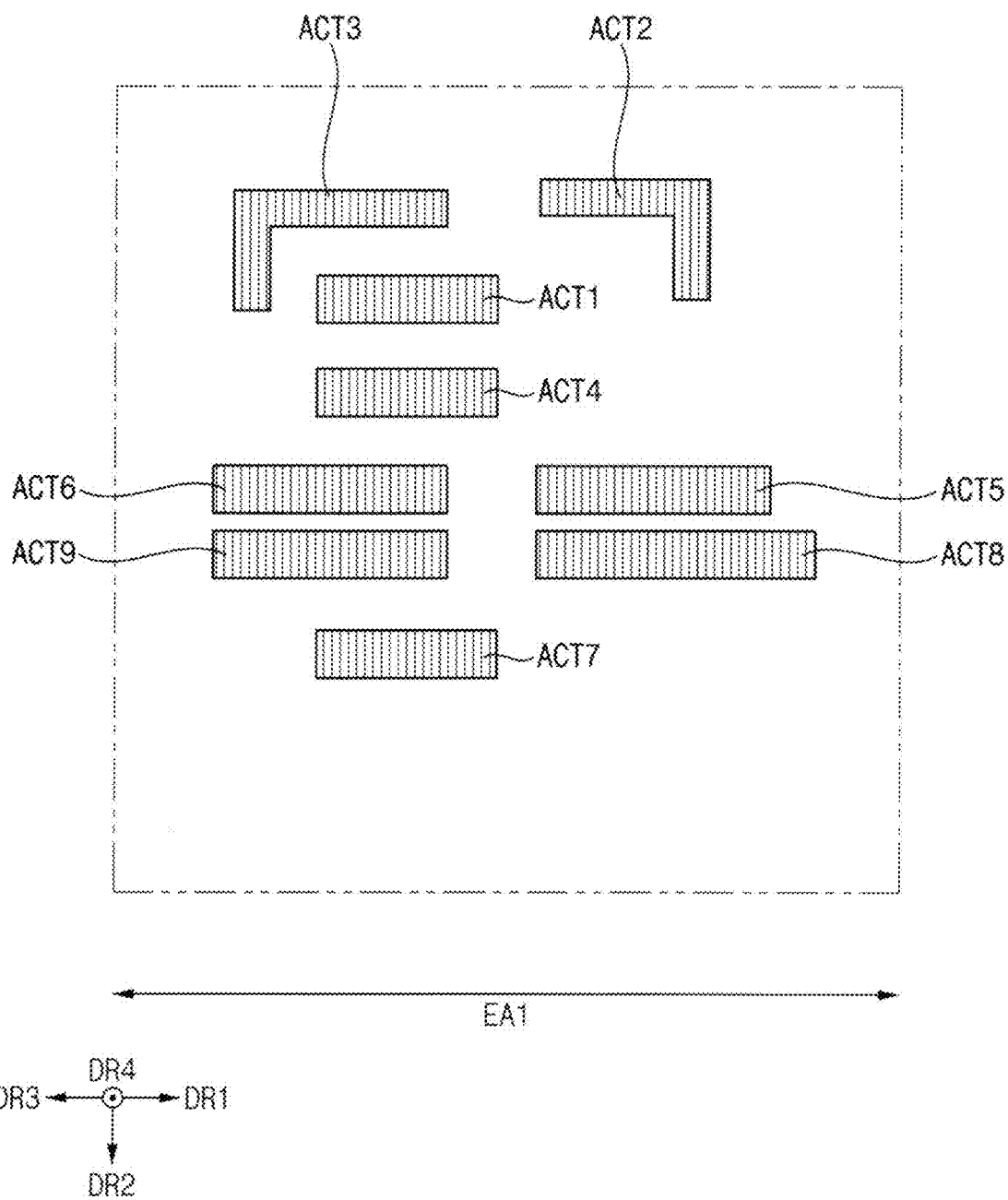
Figure 9:
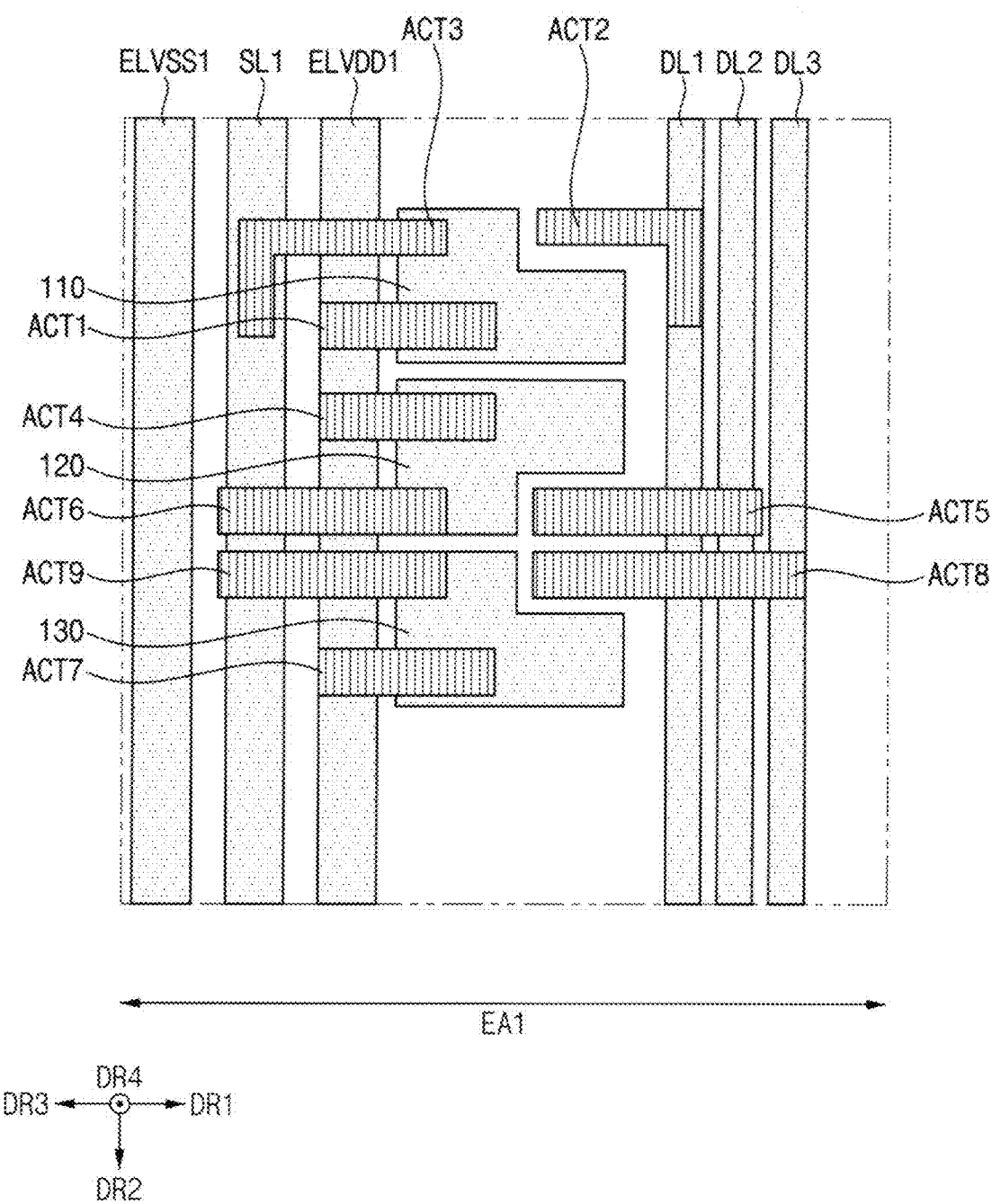
Figure 10:
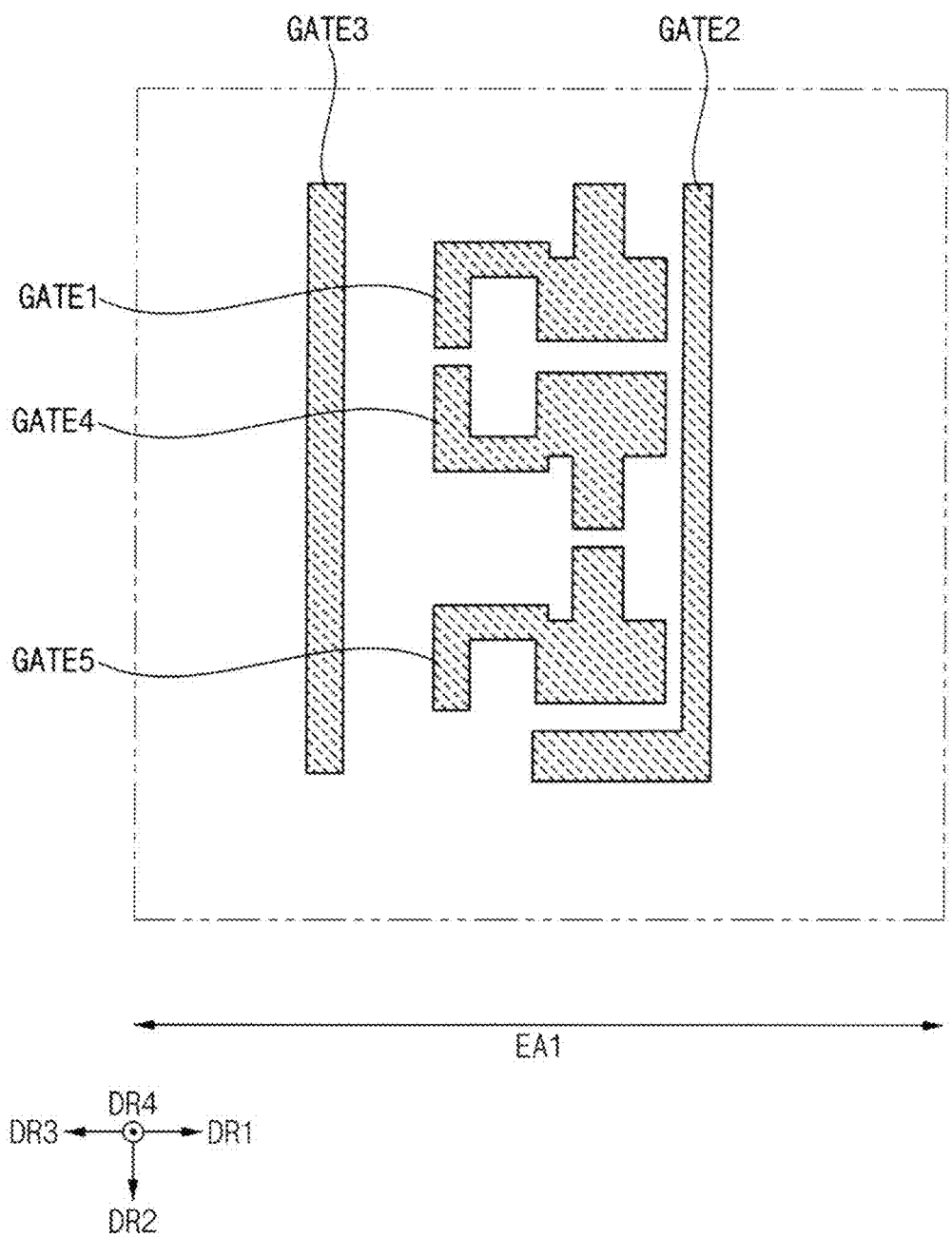
Figure 11:
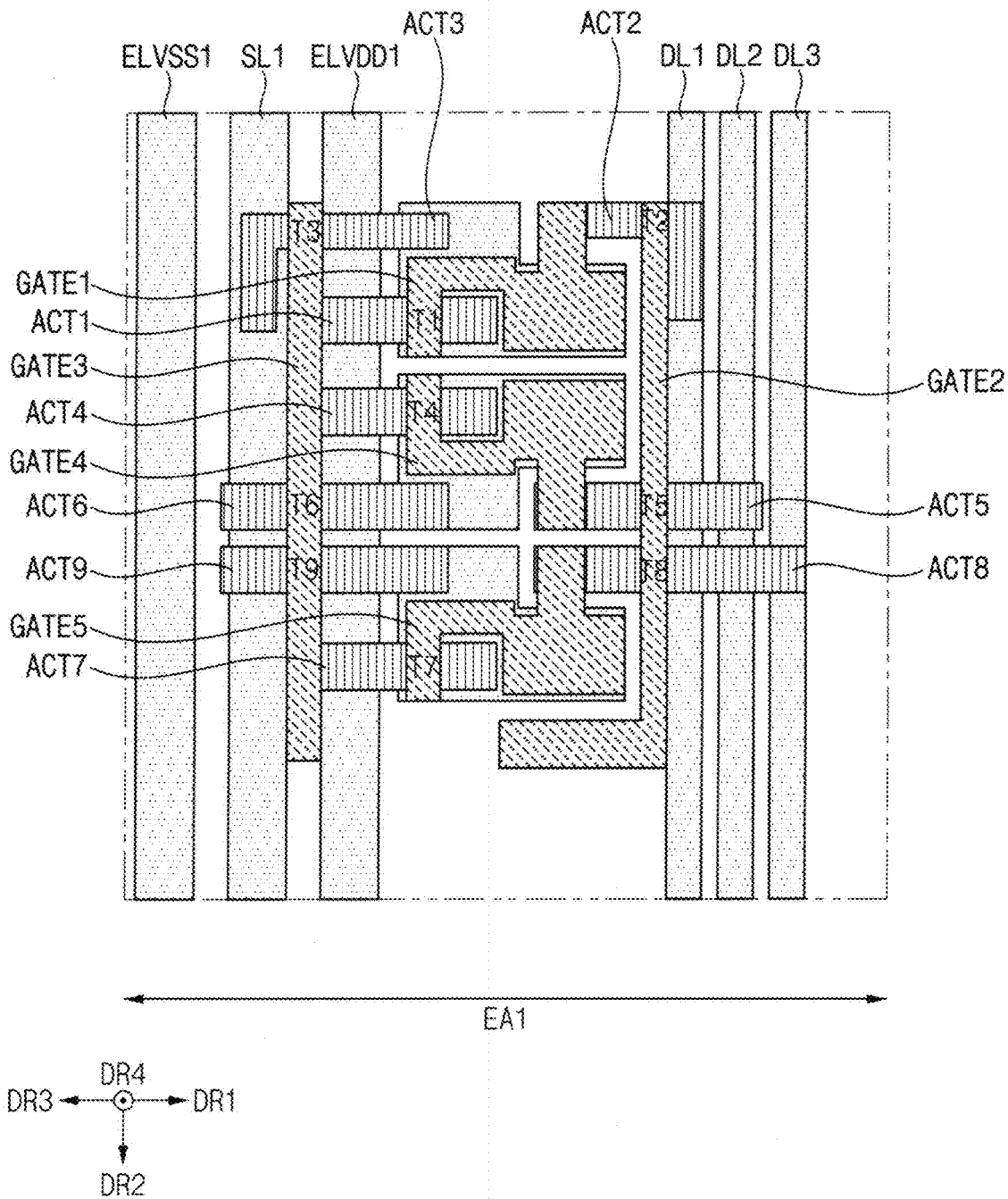
Figure 12:
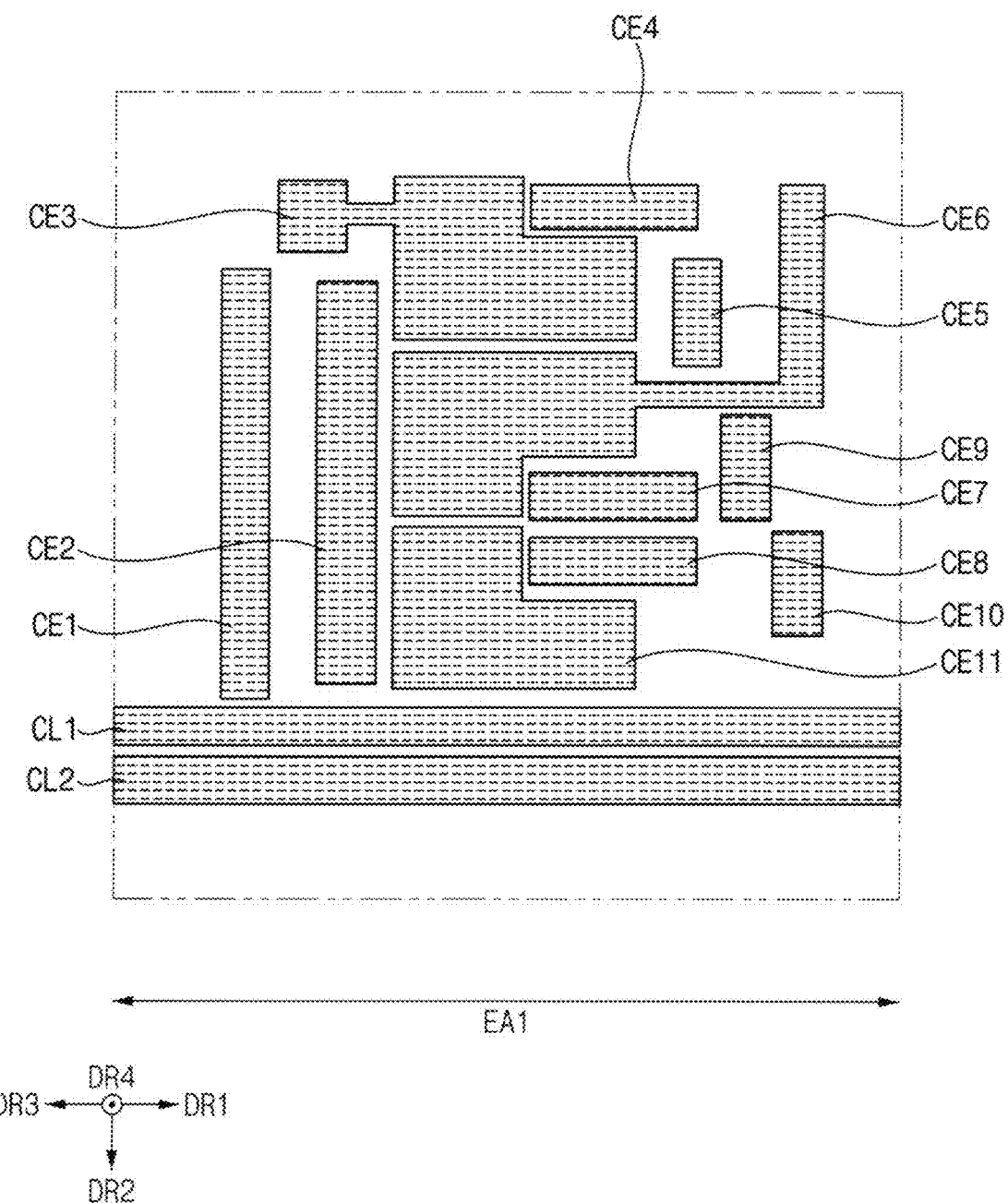
Figure 13:
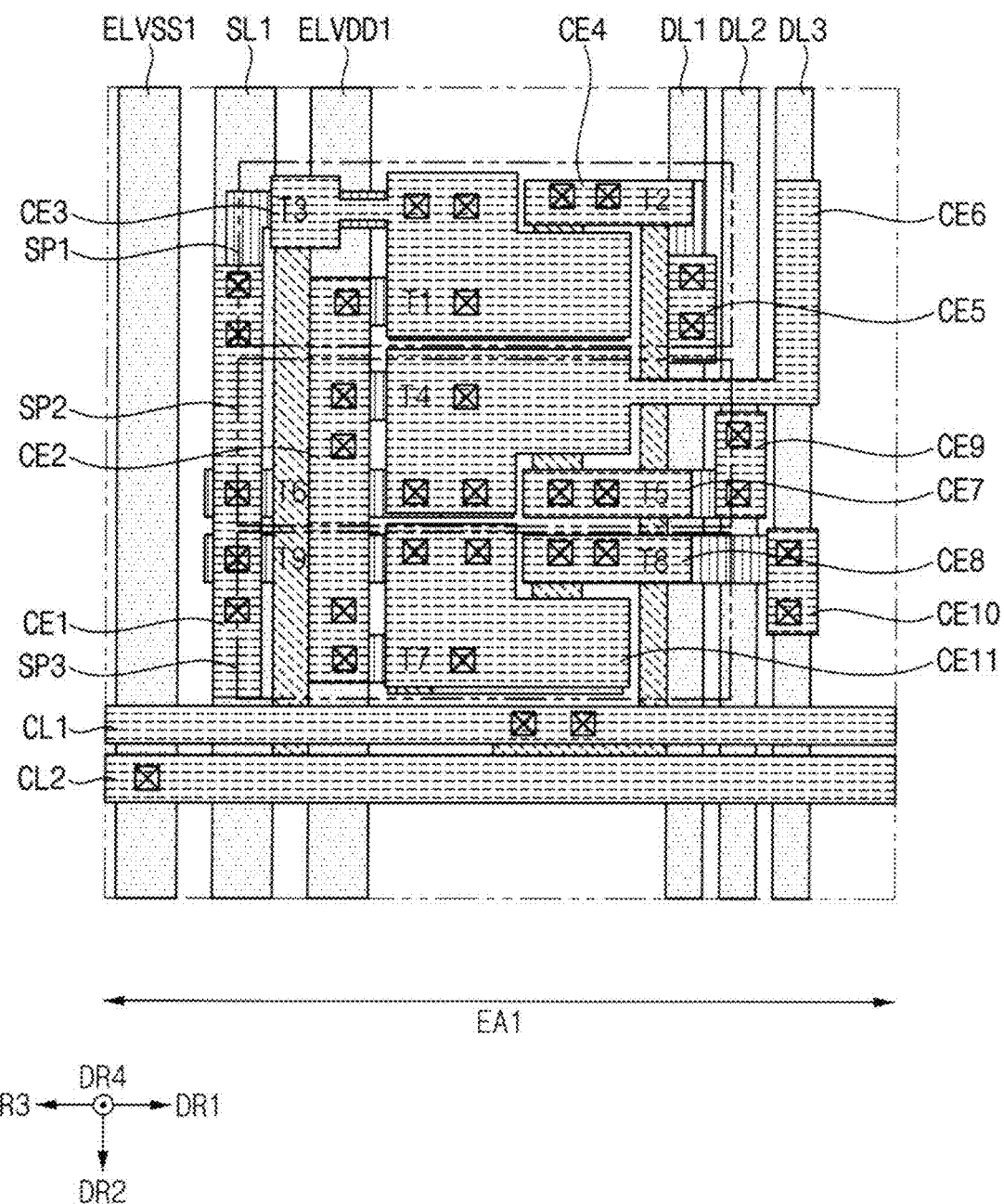
Figure 14:
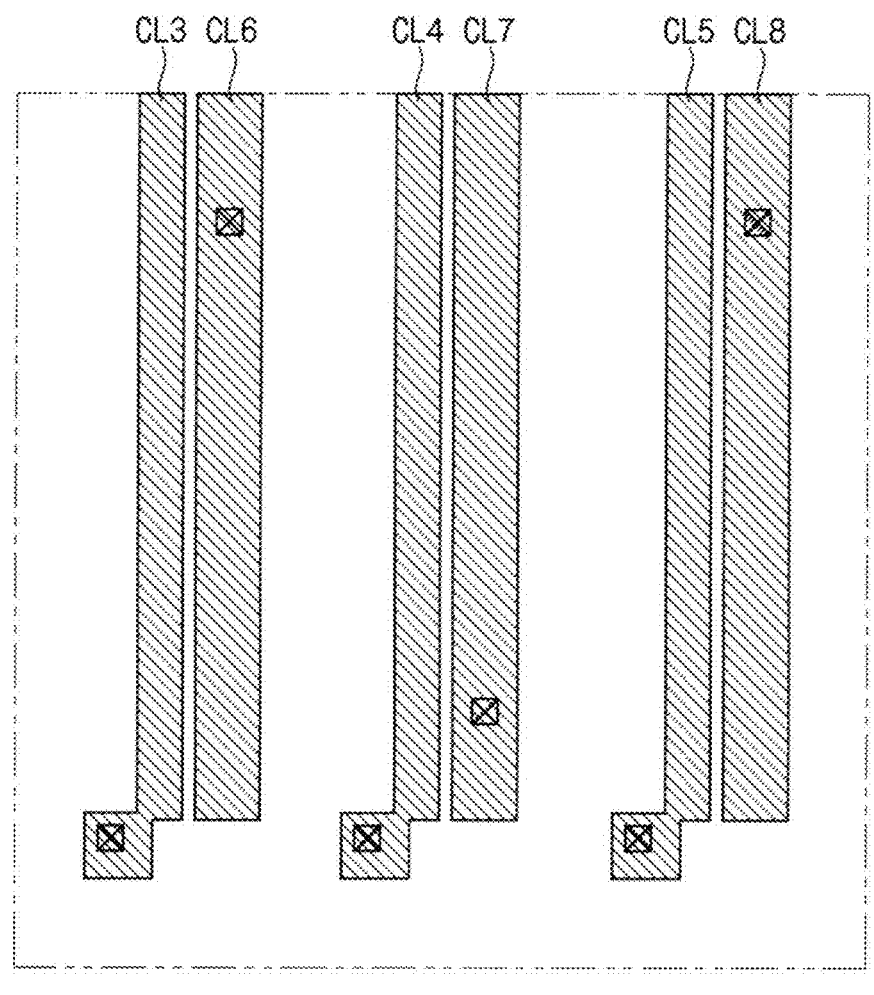
Figure 15:
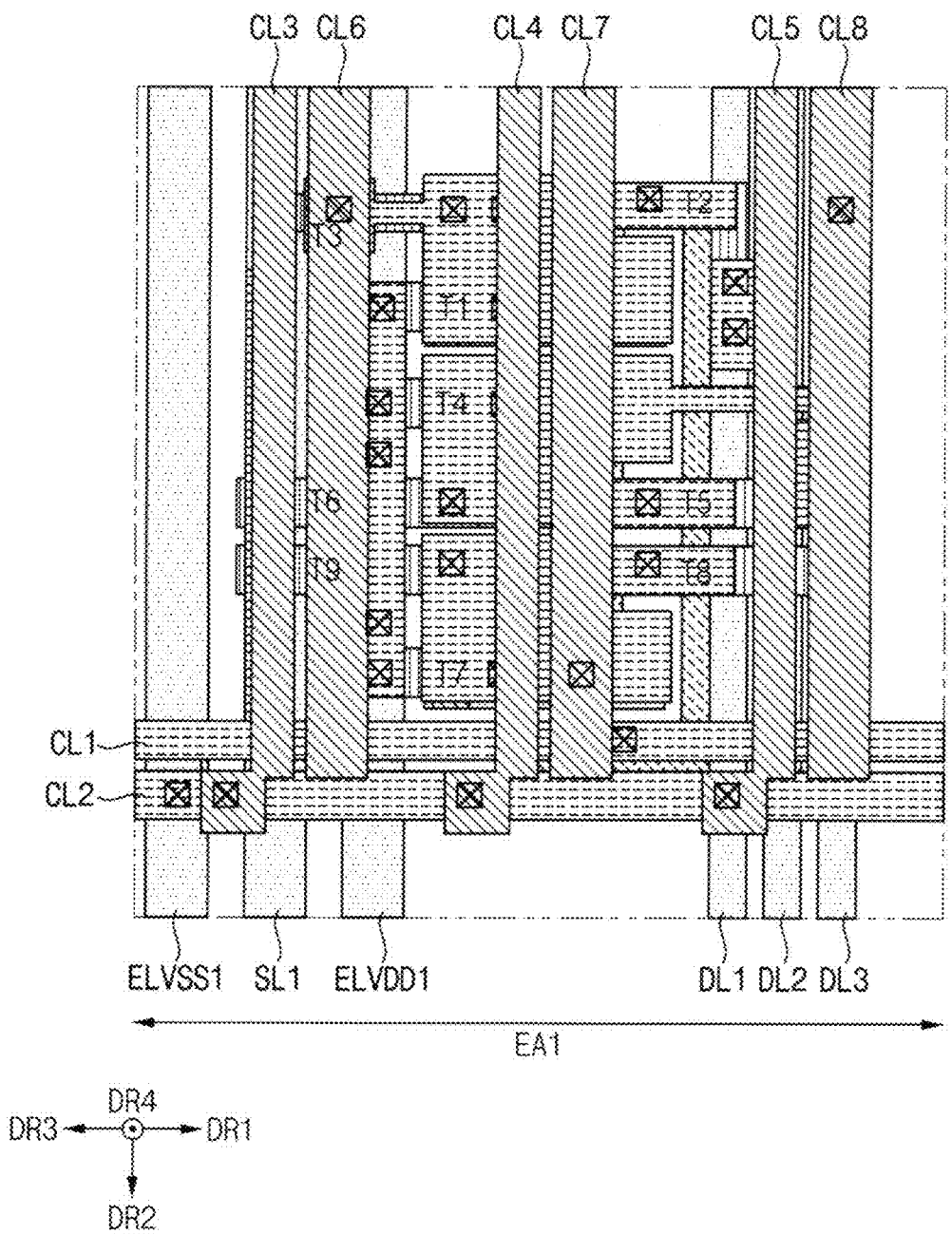

FIGS. 4 to 6 are circuit diagrams showing embodiments of a pixel circuit included in the display device of FIG. 1. FIGS. 7 to 15 are layout diagrams showing a first pixel of the display device of FIG. 1.

Referring to FIGS. 4, 5, 6, and 7, the first pixel may be disposed in a first pixel area EA1. For example, the first pixel area EA1 may be positioned in area A of FIG. 2. The first pixel may include a plurality of sub-pixels (for example, the first sub-pixel SP1, second sub-pixel SP2, and third sub-pixel SP3 of FIG. 13). For example, the first sub-pixel SP1 of FIG. 13 may correspond to the first pixel circuit PC1 of FIG. 4, the second sub-pixel SP2 of FIG. 13 may correspond to the second pixel circuit PC2 of FIG. 5, and the third sub-pixel SP3 of FIG. 13 may correspond to the third pixel circuit PC3 of FIG. 6.

The first pixel may include first metal layer. The first metal layer may include a conductive material. For example, the first metal layer may include titanium (Ti), copper (Cu), or the like. However, it is merely exemplary. The first metal layer may further include another conductive material.

The first metal layer may include a power voltage line, a first sensing line SL1, a first transfer electrode 110, second transfer electrode 120, a third transfer electrode 130, a first data line DL1, a second data line DL2, and a third data line DL3.

The power voltage line may include a low power voltage line ELVSS1 and a high power voltage line ELVDD1. A low power voltage ELVSS may be applied to the low power voltage line ELVSS1.

The high power voltage line ELVDD1 may be disposed in a first direction DR1 of the low power voltage line ELVSS1. A high power voltage ELVDD may be applied to the high power voltage line ELVDD1. The high power voltage ELVDD may be higher than the low power voltage ELVSS.

The sensing line SL1 may be disposed between the low power voltage line ELVSS1 and the high power voltage line ELVDD1. An initialization voltage VINT may be applied to the sensing line SL1.

The sensing line SL1, the low power voltage line ELVSS1, and the high power voltage line ELVDD1 may extend in a second direction DR2 perpendicular to the first direction DR1.

The first data line DL1, the second data line DL2, and the third data line DL3 may be disposed to be spaced apart from each other in the first direction DR1. A data voltages DATA1, DATA2, DATA3 may be applied to the first data line DL1, the second data line DL2, and the third data line DL3, respectively. For example, a red data voltage may be applied to the first data line DL1, a green data voltage may be applied to the second data line DL2, and a blue data voltage may be applied to the third data line DL3.

Referring to FIGS. 4, 5, 6, 8 and 9, the first pixel may include second metal layer. The second metal layer may be disposed on the first metal layer. The second metal layer may include a conductive material (for example, a transparent conductive material). For example, the second metal layer may include Indium gallium zinc oxide ("IGZO") or the like. However, this is merely exemplary. The second metal layer may further include another conductive material.

The second metal layer may include a first active pattern ACT1, a second active pattern ACT2, a third active pattern ACT3, a fourth active pattern ACT4, a fifth active pattern ACT5, a sixth active pattern ACT6, a seventh active pattern ACT7, an eighth active pattern ACT8, and a ninth active pattern ACT9.

The first active pattern ACT1 may serve as a channel of a first transistor T1. The fourth active pattern ACT4 may serve as a channel of a fourth transistor T4. The seventh active pattern ACT7 may serve as a channel of a seventh transistor T7. The second active pattern ACT2 may serve as a channel of a second transistor T2. The fifth active pattern ACT5 may serve as a channel of a fifth transistor T5. The eighth active pattern ACT8 may serve as a channel of an eighth transistor T8. The third active pattern ACT3 may serve as a channel of a third transistor T3. The sixth active pattern ACT6 may serve as a channel of a sixth transistor T6. The ninth active pattern ACT9 may serve as a channel of a ninth transistor T9.

Referring to FIGS. 4, 5, 6, 10 and 11, the first pixel may include a third metal layer. The third metal layer may be disposed on the second metal layer. The third metal layer may include a conductive material. For example, the third metal layer may include titanium (Ti), copper (Cu), or the like. However, this is merely exemplary. The third metal layer may further include another conductive material.

The first gate pattern GATE1 may partially overlap the first active pattern ACT1 in a plan view. The first gate pattern GATE1 may serve as a gate of the first transistor T1.

The second gate pattern GATE2 may partially overlap the second active pattern ACT2, the fifth active pattern ACT5, and the eighth active pattern ACT8 in a plan view. The second gate pattern GATE2 may serve as gates for the second transistor T2, the fifth transistor T5, and the eighth transistor T8.

The third gate pattern GATE3 may partially overlap the third active pattern ACT3, the sixth active pattern ACT6, and the ninth active pattern ACT5 in a plan view. The third gate pattern GATE3 may serve as gates for the third transistor T3, the sixth transistor T6, and the ninth transistor T9.

The fourth gate pattern GATE4 may partially overlap the fourth active pattern ACT4 in a plan view. The fourth gate pattern GATE4 may serve as a gate of the fourth transistor T4.

The fifth gate pattern GATE5 may partially overlap the fifth active pattern ACT5 in a plan view. The fifth gate pattern GATE5 may serve as a gate of the seventh transistor T7.

Referring to FIGS. 4, 5, 6, 11, 12 and 13, the first pixel may include a fourth metal layer. The fourth metal layer may be disposed on the third metal layer. The fourth metal layer may include a conductive material. For example, the third metal layer may include titanium (Ti), copper (Cu), or the like. However, this is merely exemplary. The fourth metal layer may further include another conductive material.

The fourth metal layer may include a first connection electrode CE1, a second connection electrode CE2, a third connection electrode CE3, a fourth connection electrode CE4, a fifth connection electrode CE5, a sixth connection electrode CE6, a seventh connection electrode CE7, an eighth connection electrode CE8, a ninth connection electrode CE9, a tenth connection electrode CE10, an eleventh connection electrode CE11, a gate line CL1, and a low power voltage transfer line CL2.

The first connection electrode CE1 may electrically connect the first sensing line SL1 to the third transistor T3, the sixth transistor T6, and the ninth transistor T9. The initialization voltage VINT supplied through the first sensing line SL1 may be applied to the first connection electrode CE1 through a contact hole. Then, the first connection electrode CE1 may be connected to each of the third active pattern ACT3, the sixth active pattern ACT6, and the ninth active pattern ACT5 through a contact hole.

The second connection electrode CE2 may electrically connect the high power voltage line ELVDD1 to the first transistor T1, the fourth transistor T4, and the seventh transistor T7. The high power voltage ELVDD supplied through the high power voltage line ELVDD1 may be applied to the second connection electrode CE2 through a contact hole. Then, the second connection electrode CE1 may be connected to each of the first active pattern ACT1, the fourth active pattern ACT4, and the seventh active pattern ACTT through a contact hole.

The third connection electrode CE3 may be electrically connected to the first active pattern ACT1 through a contact hole. The high power voltage ELVDD may be applied to the third connection electrode CE3. Accordingly, the third connection electrode CE3 may form a first capacitor CST1 with the first gate pattern GATE1. In addition, the third connection electrode CE3 may be electrically connected to the third active pattern ACT3 through a contact hole. Accordingly, the high power voltage ELVDD may be transferred to the third transistor T3. In addition, the third connection electrode CE3 may be connected to the first gate electrode GATE1 through a contact hole. The third connection electrode CE3 may transfer the first data voltage DATA1 to the third transistor T3.

The fourth connection electrode CE4 may be electrically connected to the first gate pattern GATE1 through a contact hole. The fourth connection electrode CE4 may be electrically connected to the second active pattern ACT2 through a contact hole. The first data voltage DATA1 supplied through the first data line DL1 may be applied to the fourth connection electrode CE4.

The fifth connection electrode CE5 may be electrically connected to the first data line DL1 through a contact hole. The fifth connection electrode CE5 may be electrically connected to the second active pattern ACT2 through a contact hole. Accordingly, the fifth connection electrode CE5 may transfer the first data voltage DATA1 to the second transistor T2.

The sixth connection electrode CE6 may be electrically connected to the fourth active pattern ACT4 through a contact hole. Accordingly, the high power voltage ELVDD may be applied to the sixth connection electrode CE6. The sixth connection electrode CE6 may be electrically connected to the second transfer electrode 120 through a contact hole. The sixth connection electrode CE6 may form a second capacitor CST2 with the fourth gate electrode GATE4. The sixth connection electrode CE6 may be electrically connected to the sixth active pattern ACT6 through a contact hole. Accordingly, the initialization voltage VINT may be applied to the sixth connection electrode CE6.

The seventh connection electrode CE7 may be electrically connected to the fourth gate pattern GATE4 through a contact hole. In addition, the seventh connection electrode CE7 may be electrically connected to the fifth active pattern ACT5 through a contact hole. Accordingly, a second data voltage DATA2 may be applied to the seventh connection electrode CE7.

The eighth connection electrode CE8 may be electrically connected to the fifth gate pattern GATE5 through a contact hole. In addition, the eighth connection electrode CE8 may be electrically connected to the eighth active pattern ACT8 through a contact hole. Accordingly, a third data voltage DATA3 may be applied to the eighth connection electrode CE8.

The ninth connection electrode CE9 may be electrically connected to the second data line DL2 through a contact hole. In addition, the ninth connection electrode CE9 may be electrically connected to the fifth active pattern ACT5 through a contact hole. Accordingly, the second data voltage DATA2 may be applied to the fifth transistor T5.

The tenth connection electrode CE10 may be electrically connected to the third data line DL3 through a contact hole. In addition, the tenth connection electrode CE10 may be electrically connected to the eighth active pattern ACT8 through a contact hole. Accordingly, the third data voltage DATA3 may be applied to the eighth transistor T8.

The eleventh connection electrode CE11 may be electrically connected to the seventh active pattern ACTT through a contact hole. The high power voltage ELVDD may be applied to the eleventh connection electrode CE11. The eleventh connection electrode CE11 may be electrically connected to the ninth active pattern ACT5 through a contact hole. The initialization voltage VINT may be applied to the eleventh connection electrode CE11. In addition, the eleventh connection electrode CE11 may be electrically connected to the third transfer electrode 130 through a contact hole. Accordingly, the third transfer electrode 130 may form a third capacitor CST3 with the fifth gate pattern GATE5.

The gate line CL1 may extend in the first direction DR1. The gate line CL1 may be connected to the gate driver GDV of FIG. 1. Accordingly, a gate signal GS may flow through the gate line CL1. The gate line CL1 may be electrically connected to the second gate pattern GATE2. Accordingly, the gate signal GS may be applied to the second transistor T2, the fifth transistor T5, and the eighth transistor T8.

The low power voltage transfer line CL2 may extend in the first direction DR1. The low power voltage transfer line CL2 may be electrically connected to the low power voltage line ELVSS1 through a contact hole. The low power voltage ELVSS supplied in the second direction DR2 through the low power voltage line EVLSS1 may be supplied in the first direction DR1 through the low power voltage transfer line CL2.

Referring to FIGS. 4, 5, 6, 13, 14 and 15, the first pixel may include a fifth metal layer. The fifth metal layer may be disposed on the fourth metal layer. The fifth metal layer may include a conductive material. For example, the fifth metal layer may include aluminum (Al) or the like. However, this is merely exemplary. The fifth metal layer may further include another conductive material. In the embodiments, the fifth metal layer may serve as a reflective layer.

The fifth metal layer may include a first low power voltage connection line CL3, a second low power voltage connection line CL4, a third low power voltage connection line CL5, a first high power voltage connection line CL6, a second high power voltage connection line CL7, and a third high power voltage connection line CL8.

The first low power supply voltage connection line CL3, the second low power supply voltage connection line CL4, and the third low power supply voltage connection line CL5 may be electrically connected to the low power supply transfer line CL2 through contact holes, respectively. Accordingly, the low power voltage ELVSS may be applied to the first low power voltage connection line CL3, the second low power voltage connection line CL4, and the third low power voltage connection line CL5. The first low power voltage connection line CL3, the second low power voltage connection line CL4, and the third low power voltage connection line CL5 may be connected to a cathode electrode of a light emitting device. In the embodiments, the light emitting device may include an organic light emitting diode (OLED), a quantum-dot organic light emitting diode (QDOLED), a quantum-dot nano light emitting diode (QNED), or the like.

The first high power voltage connection line CL6 may be electrically connected to the third connection electrode CE3 through a contact hole. The first high power voltage connection line CL6 may receive the high power voltage ELVDD from the third connection electrode CE3. The first high power voltage connection line CL6 may be electrically connected to a first anode electrode of the light emitting device.

The second high power voltage connection line CL7 may be electrically connected to the eleventh connection electrode CE11 through a contact hole. The second high power voltage connection line CL7 may receive the high power voltage ELVDD from the eleventh connection electrode CE11. The second high power voltage connection line CL7 may be electrically connected to a second anode electrode of the light emitting device.

The third high power voltage connection line CL8 may be electrically connected to the sixth connection electrode CE6 through a contact hole. The third high power voltage connection line CL8 may receive the high power voltage ELVDD from the sixth connection electrode CE6. The third high power voltage connection line CL8 may be electrically connected to a third anode electrode of the light emitting device.

Figure 16:
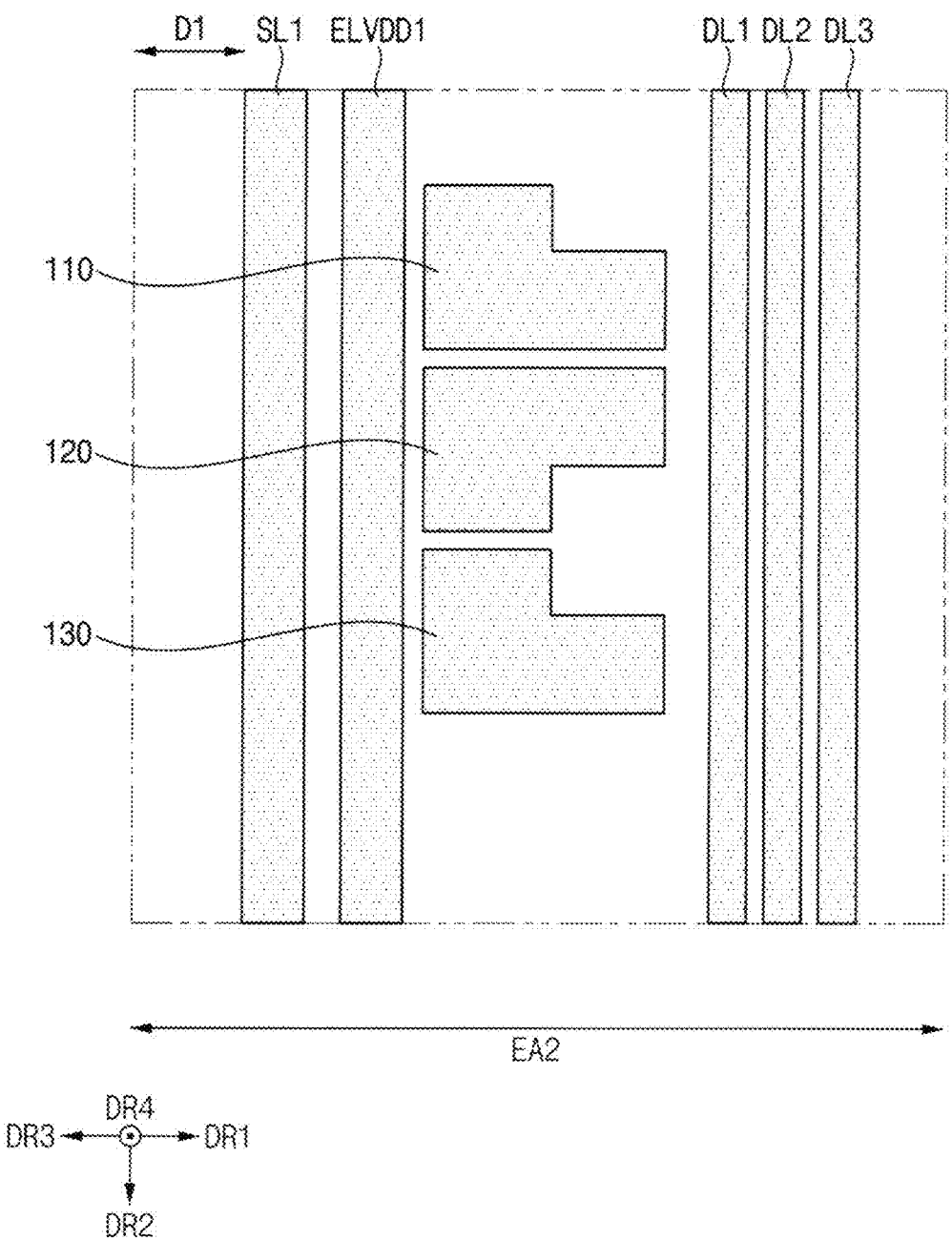
FIGS. 16 and 17 are layout diagrams showing a second pixel of the display device of FIG. 1.
Figure 17:
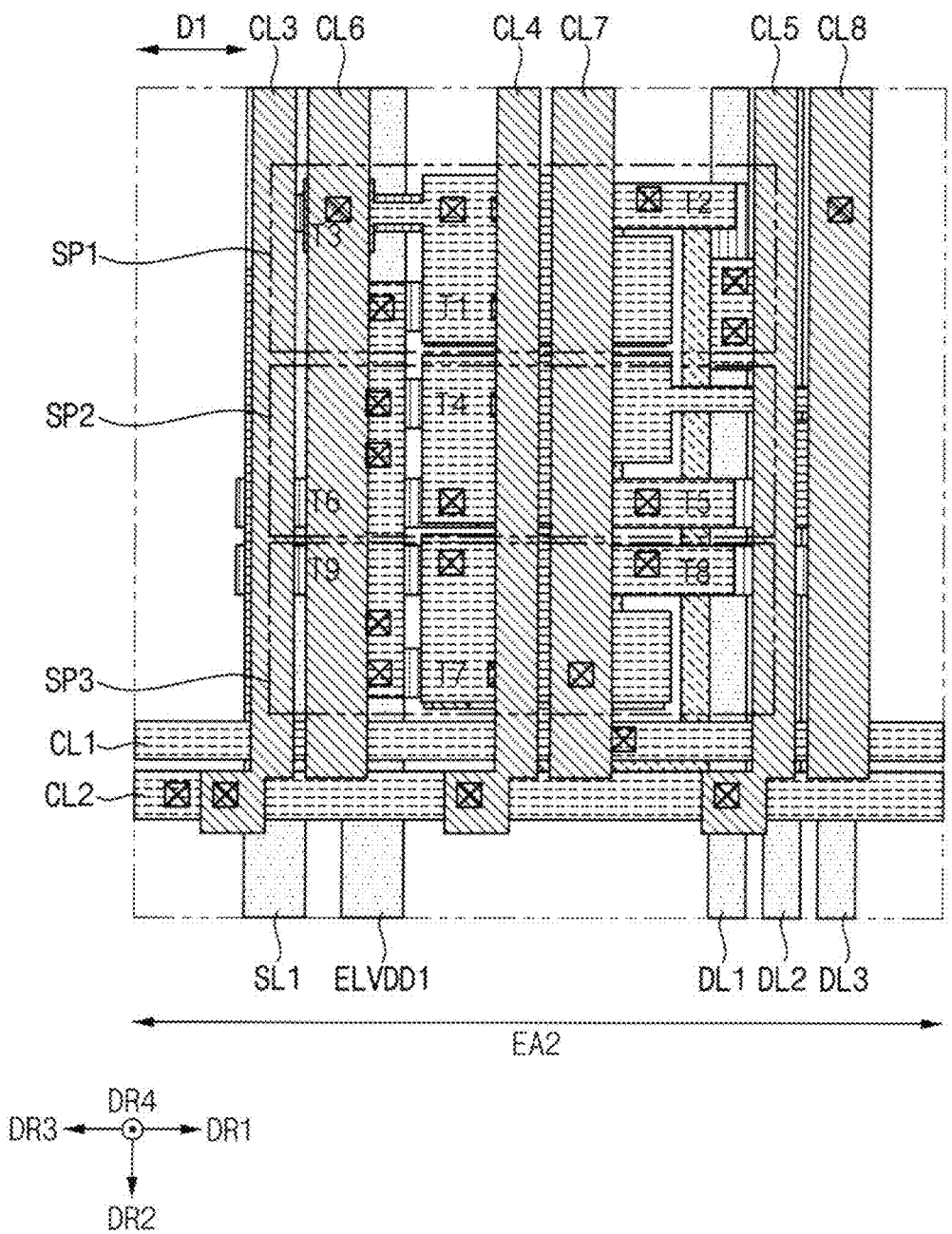

FIGS. 16 and 17 are layout diagrams showing a second pixel of the display device of FIG. 1. The second pixel may be substantially the same as the first pixel of FIG. 7 except that the low power voltage line is not included in the first metal layer. Accordingly, the description for duplicate components will be omitted.

Referring to FIGS. 4, 5, 6, 16 and 17, the second pixel may be disposed in the second pixel area EA2. For example, the second pixel area EA2 may be positioned in area B of FIG. 2. The second pixel may include a first sub-pixel SP1, a second sub-pixel SP2, and a third sub-pixel SP3. For example, the first sub-pixel SP1 may correspond to the first pixel circuit PC1, the second sub-pixel SP2 may correspond to the second pixel circuit PC2, and the third sub-pixel SP3 may correspond to the third pixel circuit PC3.

The second pixel may be supplied with the low power voltage ELVSS from the first pixel. In the embodiments, the gate line CL1 and the low power voltage transfer line CL2 may extend to the second pixel area EA2. The second pixel may be electrically connected to the gate line CL1 and the low power voltage transfer line CL2. The second pixel may be connected to cathode electrodes of the light emitting device through a plurality of low power voltage connection lines CL3, CL4, and CL5. In addition, the second pixel may be connected to anode electrodes of the light emitting device through a plurality of high power voltage connection lines CL6, CL7, and CL8.

Accordingly, the second pixel may not have a separate low power voltage line and may receive the low power voltage ELVSS from the first pixel. Accordingly, the second pixel may additionally utilize a space in which the low power voltage line is supposed to be disposed in other cases. For example, the second pixel may be shifted in a third direction DR3 opposite to the first direction DR1 by a width D1 of the space in which the low power voltage line is supposed to be disposed in other cases.

Figure 18:
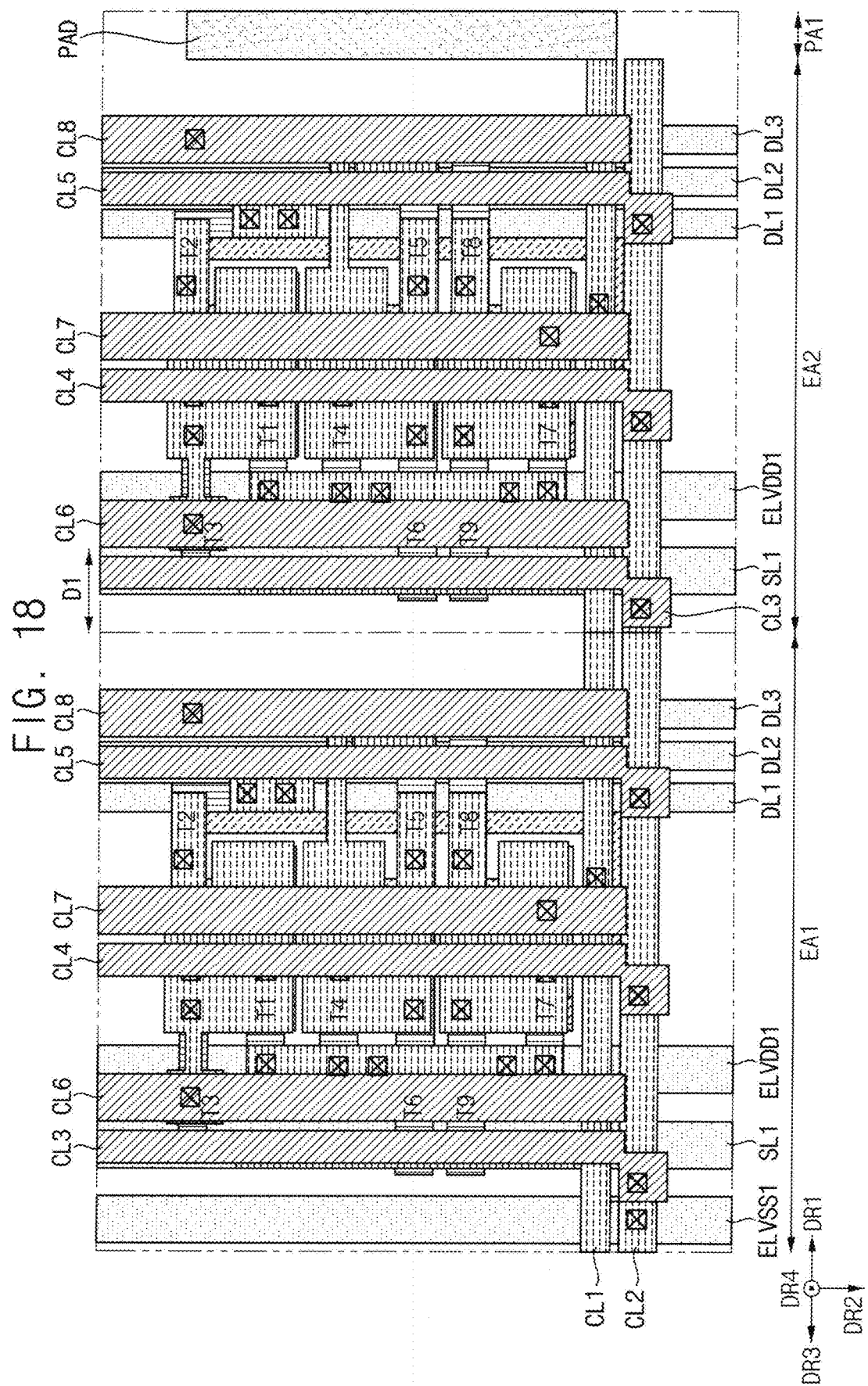
FIG. 18 is a layout diagram showing the first pixel and the second pixel of the display device of FIG. 1.

FIG. 18 is a layout diagram showing the first pixel, the second pixel, and the connection pad of the display device of FIG. 1.

Referring to FIG. 18, the first pixel and the second pixel may be disposed adjacent to each other. The gate line CL1 and the low power voltage transfer line CL2 may extend from the first pixel area EA1 to the second pixel area EA2. In the embodiments, the gate line CL1 may be connected to the connection pad PAD. The connection pad PAD may be disposed in the first pad area PA1.

Figure 19:
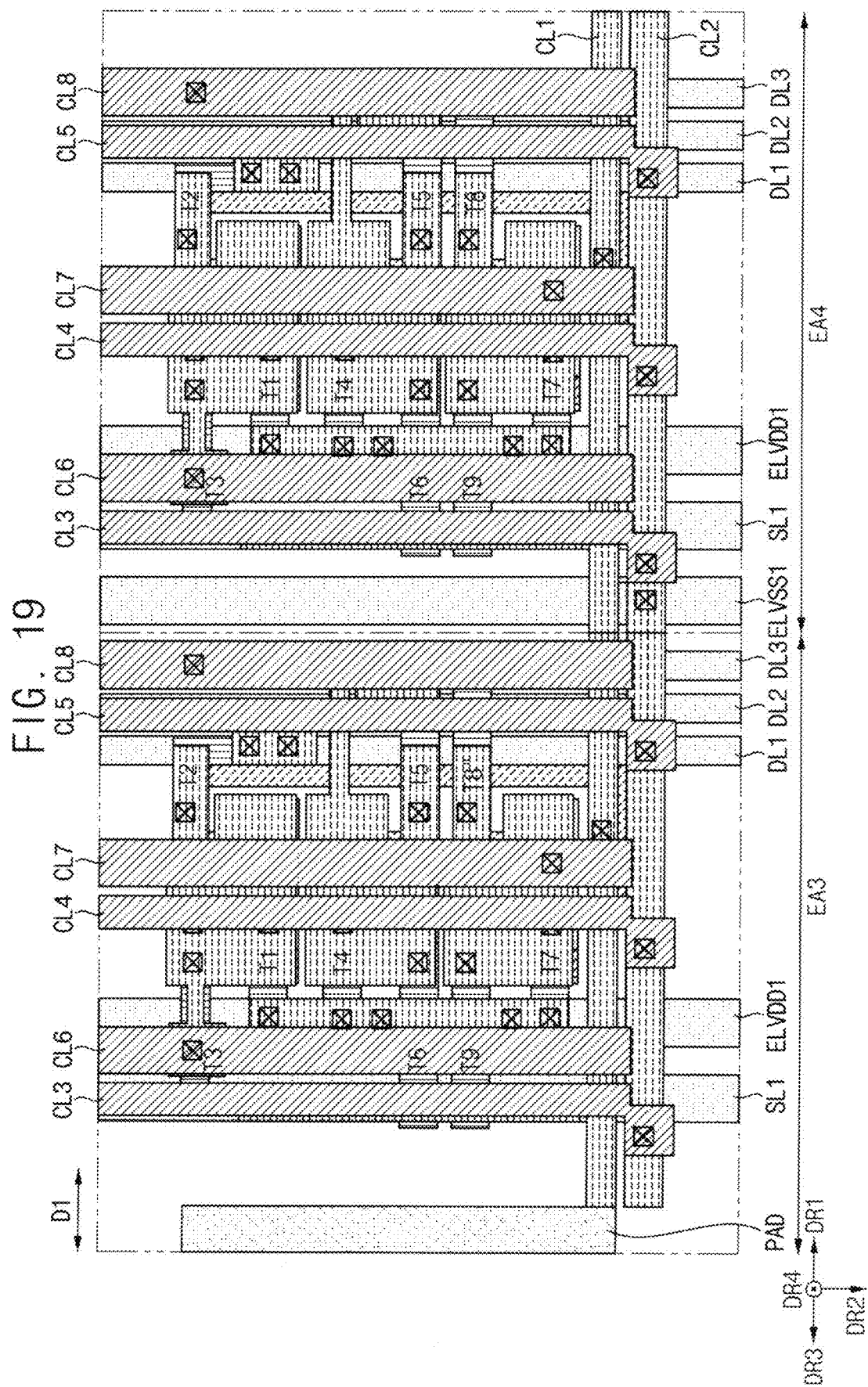
FIG. 19 is a layout diagram showing a third pixel and a fourth pixel of the display device of FIG. 1.

FIG. 19 is a layout diagram showing a third pixel and a fourth pixel of the display device of FIG. 1.

Referring to FIG. 19, the display device may include a third pixel and a fourth pixel. The third pixel may be disposed in the third pixel area EA3. For example, the third pixel area EA3 may be positioned in area A of FIG. 2. The third pixel may be substantially the same as the structure of the second pixel. The fourth pixel may be disposed in a fourth pixel area EA4. For example, the fourth pixel area EA4 may be positioned in area B of FIG. 2. The structure of the fourth pixel may be substantially the same as that of the first pixel. In other words, the fourth pixel may include the low power voltage line ELVSS1, and the third pixel may not include the low power voltage line. For a purpose to distinguish the low power voltage line ELVSS1 in the fourth pixel from the low power voltage line ELVSS1 in the first pixel, the low power voltage line ELVSS1 in the first pixel may be referred to as a first low power voltage line, and the low power voltage line ELVSS1 in the fourth pixel may be referred to as a second low power voltage line. The third pixel may receive the low power voltage ELVSS from the fourth pixel. Accordingly, the third pixel may additionally utilize a space in which the low power voltage line is supposed to be disposed in other cases. For example, the connection pad PAD may be disposed in the space. The connection pad PAD may be electrically connected to the gate line CL1. For a purpose to distinguish the gate line CL1 in the area B from the gate line CLI in the area A, the gate line CL1 in the area A may be referred to as a first gate line, and the gate line CL1 in the area B may be referred to as a second gate line. Additionally, for a purpose to distinguish the connection pad PAD in the area B from the connection pad PAD in the area A, the connection pad PAD in the area A may be referred to as a first connection pad, and the connection pad PAD in the area B may be referred to as a second connection pad.

Accordingly, even when the connection pad PAD is disposed in the third pixel area EA3, the distance between the third pixel and the pixel (for example, the second pixel of FIG. 18) disposed in the third direction DR3 of the third pixel may not increase significantly. The distances between the first to fourth pixels disposed in the first to fourth light emitting areas EA1, EA2, EA3, and EA4 may be maintained in the substantially same way. That is, for example, the distance in the first direction DR1 between the first pixel and the second pixel is the same as the distance between the second pixel and the third pixel, even though the connection pad PAD is further disposed between the second pixel and the third pixel and the connection pad is not disposed between the first pixel and the second pixel. Thus, according to the display device of the invention, the connection area (for example, a seam-line or the like) may not be visually recognized at a portion where a plurality of sub-display panels are connected. In other words, a gap difference may be generated between the first to fourth pixels (e.g., the gap in the first direction DR1 between the second and third pixels is different from the gap between the third and fourth pixels), so that a dead space (i.e., a space where a pixel is not disposed) of the connection area between the sub-display panels may be prevented from being visually recognized.

Figure 20:
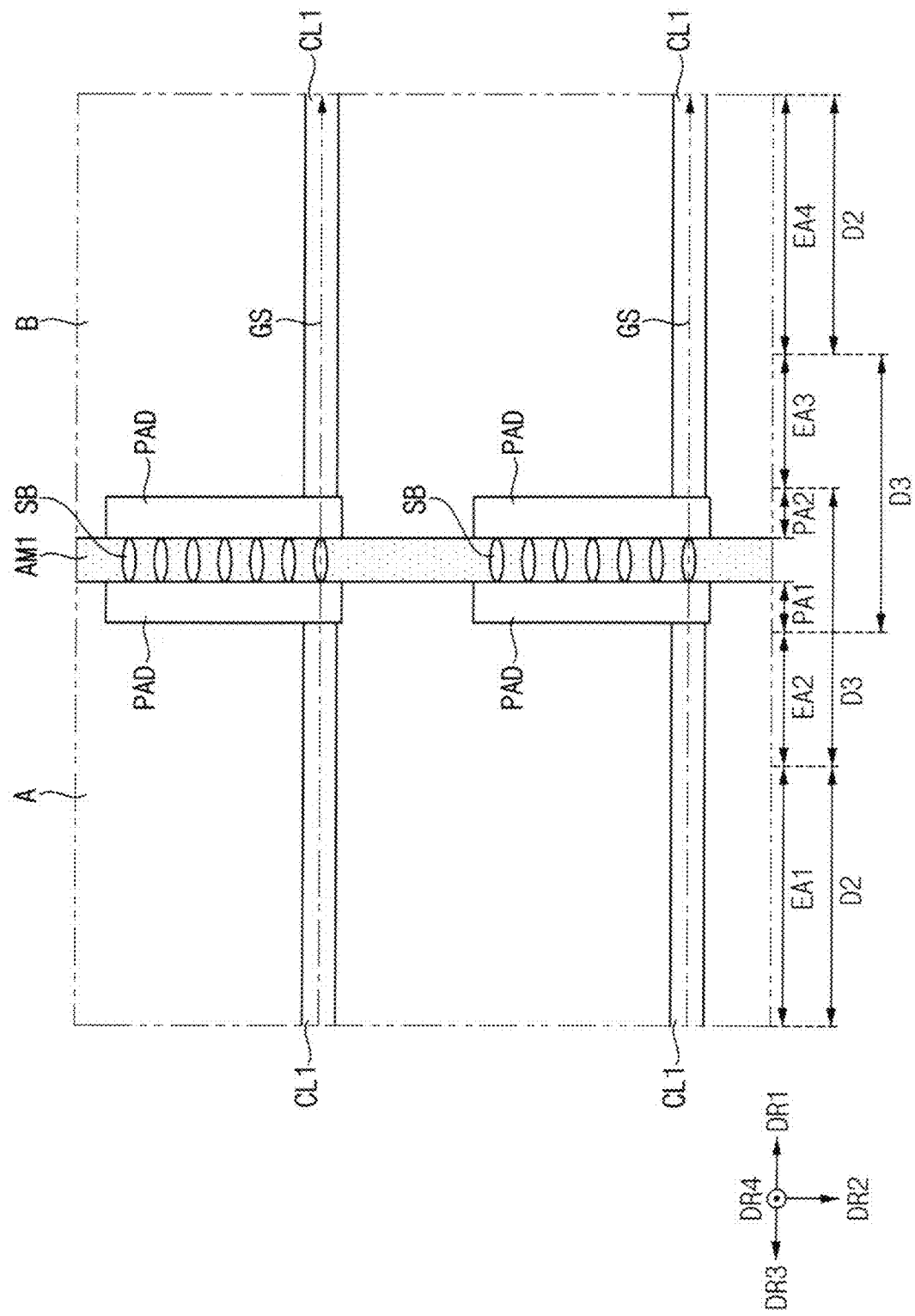
FIG. 20 is an enlarged view showing one embodiment of areas A and B of FIG. 2.

FIG. 20 is an enlarged view showing one embodiment of areas A and B of FIG. 2.

Referring to FIGS. 2, 3 and 20, the display device may include a first connection member AM1. In the embodiments, the first connection member AM1 may include a conductive material. For example, the first connection member AM1 may include an anisotropic conductive film. The first connection member AM1 may include a plurality of conductive balls SB. At this point, the conductive balls SB may overlap the connection pads PAD in the first direction DR1. The gate signal GS may flow only through the conductive balls SB in the first connection member AM1. Accordingly, it may be entirely disposed to overlap the area A and the area B, and the conductive balls SB may be disposed to overlap the pads PAD in the first direction DR1.

The area A and the area B may be adhered to each other by the first connection member AM1. The area A and the area B may be electrically connected to each other by the first connection member AM1. In other words, the first connection member AM1 may electrically connect the first sub-display panel SDP1 to the second sub-display panel SDP2. For example, the gate signal GS flowing from the area A through the gate line CL1 (i.e., the first gate line) may be transferred to the area B through the connection pads PAD and the first connection member AM1, and then the gate signal GS may flow through the gate line CL1 (i.e., the second gate line) in the area B.

In the embodiments, at least one first pixel, second pixel, and connection pad PAD may be disposed in the area A. At least one third pixel, fourth pixel, and connection pad PAD may be disposed in the area B. As described above, the structure of the first pixel may be substantially the same as that of the fourth pixel, and the structure of the second pixel may be substantially the same as that of the third pixel.

Figure 21:
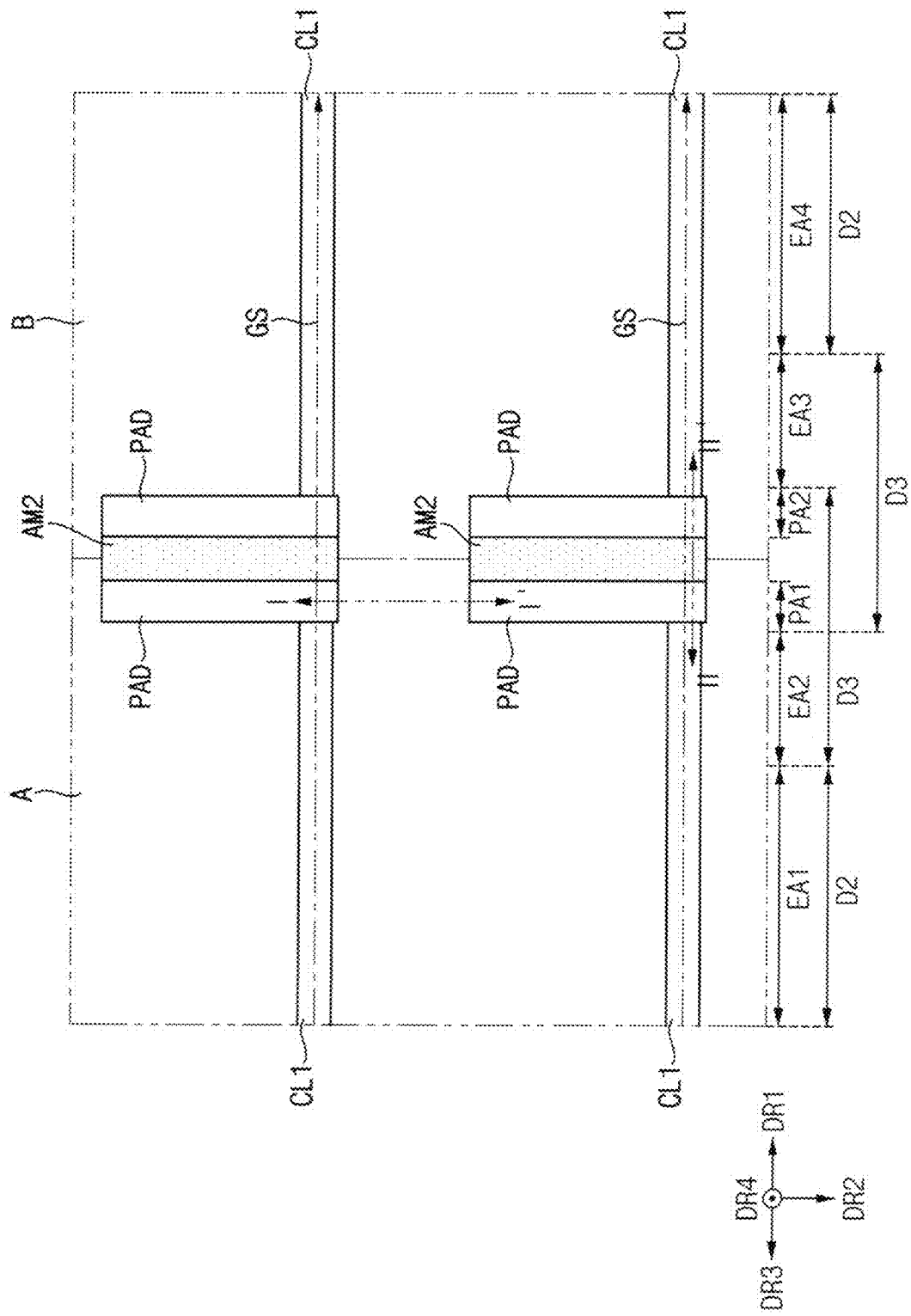
FIG. 21 is an enlarged view showing another embodiment of areas A and B of FIG. 2.

FIG. 21 is an enlarged view showing another embodiment of the areas A and B of FIG. 2. FIG. 21 may be substantially the same as FIG. 20 except for the type of the connection member. Accordingly, the description for duplicate components will be omitted.

Referring to FIGS. 2, 3 and 21, the display device may include a second connection member AM2. The second connection member AM2 may bond the first sub-display panel SDP1 and the second sub-display panel SDP2 to each other. In the embodiments, the second connection member AM2 may include a conductive material. For example, the second connection member AM2 may include a conductive film. For example, the second connection member AM2 may include an adhesive silver paste. In addition, the second connection member AM2 may have adhesiveness for connecting the area A to the area B, and may include a material having conductivity to transfer the gate signal GS between the area A and the area B. At this point, because the second connection member AM2 has the conductivity itself, the second connection member AM2 may be disposed to overlap only the connection pads PAD in the first direction DR1. In other words, the second connection member AM2 may overlap the connection pads PAD in the first direction DR1. Accordingly, the area A and the area B may be electrically connected to each other by the second connection member AM2. In other words, the second connection member AM2 may electrically connect the first sub-display panel SDP1 to the second sub-display panel SDP2.

The second and third pixels included in FIGS. 20 and 21 may not include a low power voltage line. Accordingly, widths of the second pixel area EA2 and the third pixel area EA3 in the first direction DR1 may be reduced. Accordingly, even when the pads PAD and the connection members AM1 and AM2 are disposed, a gap difference between the pixel areas may be minimized. For example, a distance between an end of the first pixel area EA1 in the third direction DR3 and an end of the second pixel area EA2 in the third direction DR3 may be defined as D2, and a distance between an end portion of the fourth pixel area EA4 in the first direction DR1 and an end portion of the third pixel area EA3 in the first direction DR1 may be defined as D2. In addition, a distance between an end of the second pixel area EA2 in the third direction DR3 and an end of the third pixel area EA3 in the third direction DR3 may be defined as D3, and a distance between an end of the second pixel area EA2 in the first direction DR1 and an end of the third pixel area EA3 in the first direction DR1 may also be D3. In the present invention, since the low power voltage line is not disposed in the second pixel area EA2 and the third pixel area EA3, a space in which the pads PAD are disposed may be secured. In addition, even when the pads PAD are disposed, the difference between D2 and D3 may not increase. Accordingly, viewers watching the display device may feel that the gap between the first to fourth pixels is constant, so that the viewers may not visually recognize a seam-line due to the connection members AM1 and AM2 and the pads PAD.

Figure 22:
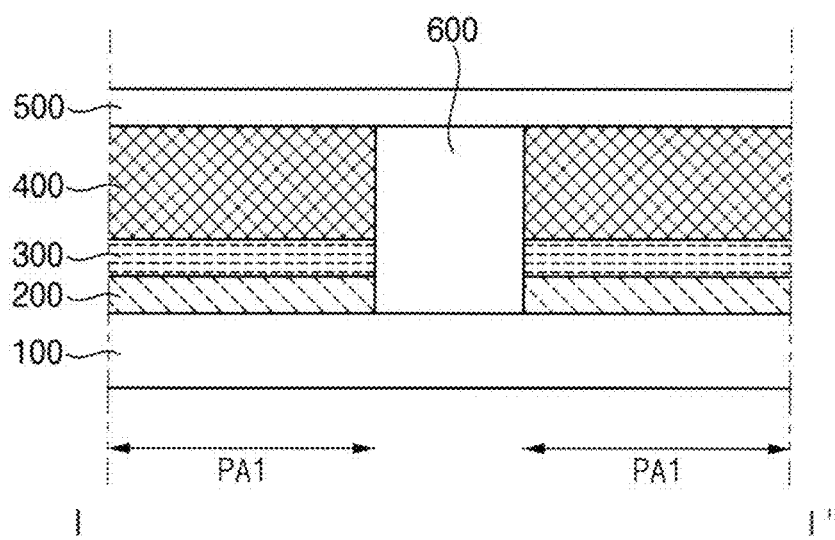
FIG. 22 is a sectional view showing one embodiment taken along line I-I' of FIG. 21.

FIG. 22 is a sectional view showing one embodiment taken along line I-I of FIG. 21.

Referring to FIGS. 2, 21 and 22, the display device may include a substrate 100, a first conductive layer 200, a second conductive layer 300, a via-insulating layer 400, an inorganic insulating layer 500, and a partition wall 600.

The substrate 100 may include a rigid material or a flexible material. The first conductive layer 200 may be disposed on the substrate 100. The first conductive layer 200 may include the same material as the third metal layer of FIG. 10. The first conductive layer 200 may be formed simultaneously with the third metal layer.

The second conductive layer 300 may be disposed on the first conductive layer 200. The second conductive layer 300 may include the same material as the fourth metal layer of FIG. 12. The second conductive layer 300 may be formed simultaneously with the fourth metal layer. The second conductive layer 300 may be connected to the gate line CL1 of FIG. 21. In other words, the gate signal GS flowing through the gate line CL1 may be applied to the second conductive layer 300.

The first conductive layer 200 and the second conductive layer 300 may contact with each other. The thickness of the first conductive layer 200 and the second conductive layer 300 in the fourth direction DR4 (i.e., thickness direction) may increase, so that an electric signal may effectively flow the first conductive layer 200 and the second conductive layer 300. Accordingly, the gate signal GS transferred through the gate line CL1 may effectively flow through the first conductive layer 200 and the second conductive layer 300.

The vi-insulating layer 400 may include an insulating material. For example, the via-insulating layer 400 may include silicon oxide, silicon nitride, silicon oxynitride, polyamide, or the like. A thickness of the via-insulating layer 400 may be thicker than a total thickness of the conductive layers 200 and 300 in the thickness direction (i.e., the fourth direction DR4). Accordingly, the via-insulating layer 400 may secure an enough contact area with the second connection member AM2. Accordingly, an adhesive strength between the second connection member AM2 and the first sub-display panel SDP1 and the second sub-display panel SDP2 may increase. FIGS. 22 to 25 are described based on the second connection member AM2, however, it may be applied to the first connection member AM1 of FIG. 20 in the same manner.

The partition wall 600 may be disposed on the substrate. The partition wall 600 may include an insulating material. The partition wall 600 may include an organic insulating material and an inorganic insulating material. For example, the partition wall 600 may have a structure in which the organic insulating material and the inorganic insulating material are laminated.

The inorganic insulating layer 500 may be disposed on the via-insulating layer 400 and the partition wall 600. In the embodiments, the inorganic insulating layer 500 may include an inorganic insulating material. Accordingly, the inorganic insulating layer 500 may protect the display device from external substances and external impacts.

Figure 23:
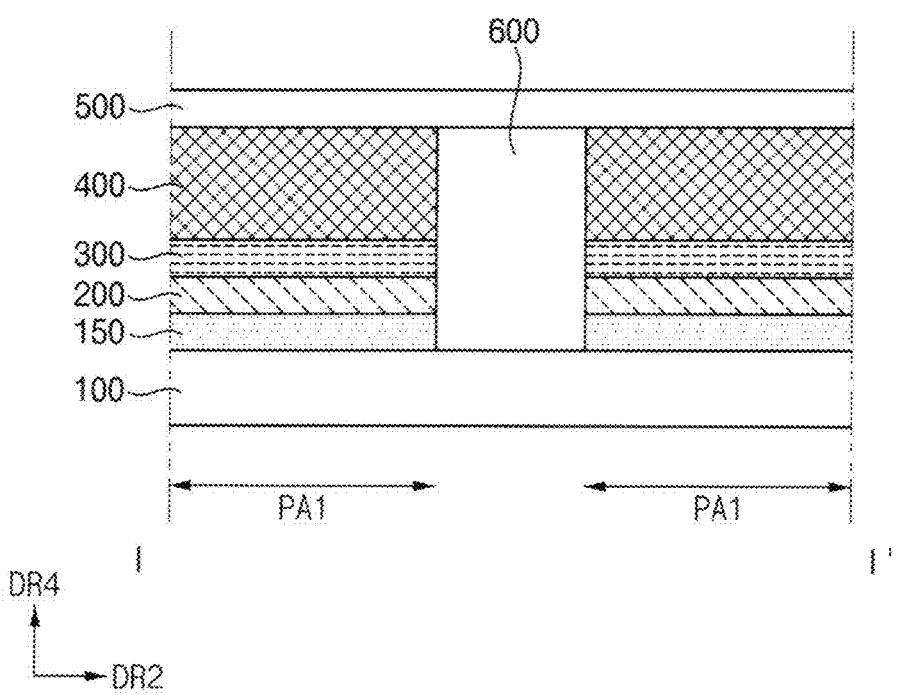
FIG. 23 is a sectional view showing another embodiment taken along line I-I' of FIG. 21.

FIG. 23 is a sectional view showing another embodiment taken along line I-I of FIG. 21. FIG. 23 may be substantially the same as FIG. 22 except that a third conductive layer 150 is added. Accordingly, the description for duplicate components will be omitted.

Referring to FIGS. 2, 21 and 23, the third conductive layer 150 may be disposed on the substrate 100. The third conductive layer 150 may include the same material as the first metal layer of FIG. 7. The third conductive layer 150 may be formed simultaneously with the first metal layer. The first conductive layer 200 may be disposed on the third conductive layer 150.

In the embodiments, the first conductive layer 200 may contact with the second conductive layer 300 and the third conductive layer 150. Accordingly, the gate signal GS transferred through the gate line CL1 may effectively flow through the first conductive layer 200, the second conductive layer 300, and the third conductive layer 150.

Figure 24:
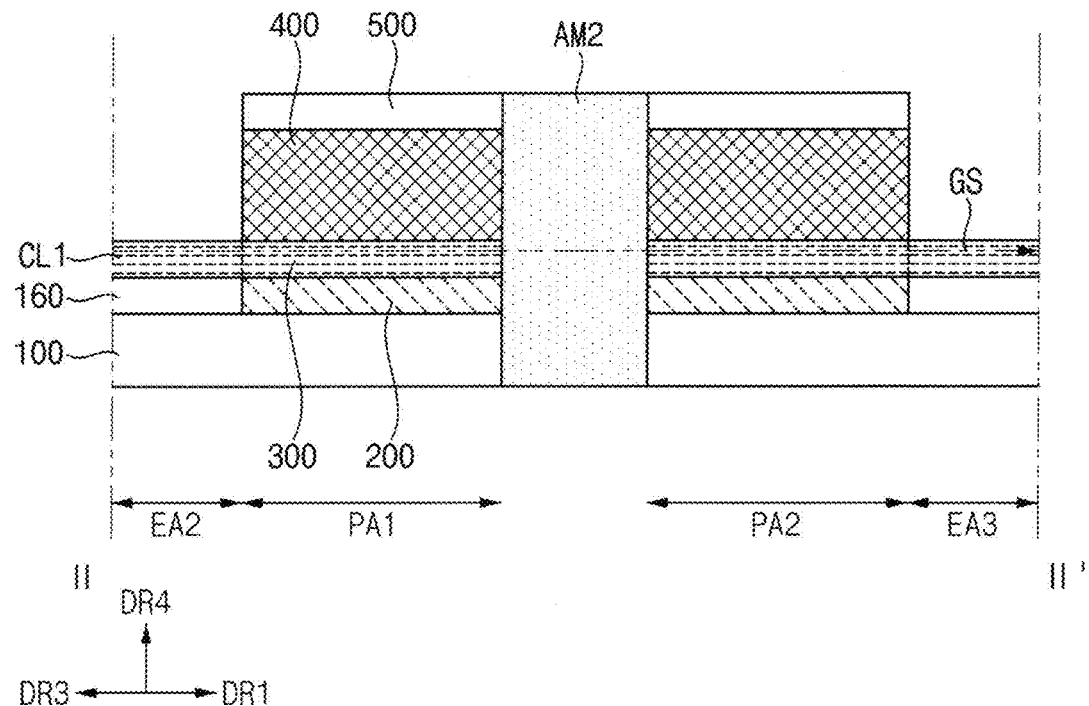
FIG. 24 is a sectional view showing one embodiment taken along line II-II' of FIG. 21.

FIG. 24 is a sectional view showing one embodiment taken along line II-II' of FIG. 21.

Referring to FIGS. 2, 21 and 24, the first conductive layer 200 may be disposed on the substrate 100. The first conductive layer 200 may overlap the first pad area PA1 in a plan view. A first insulating layer 160 may be disposed in the third direction DR3 of the first conductive layer 200 in the third pixel area EA3. The first insulating layer 160 may include an insulating material. For example, the first insulating layer 160 may include silicon oxide, silicon nitride, silicon oxynitride, or the like.

The second conductive layer 300 may be disposed on the first conductive layer 200. The second conductive layer 300 may be connected to the gate line CL1. The via-insulating layer 400 and the inorganic insulating layer 500 may be disposed on the second conductive layer 300.

In the embodiments, when the first conductive layer 200 and the second conductive layer 300 contact with each other, the gate signal GS flowing through the gate line CL1 may be effectively transferred in the pad areas PA1 and PA2.

The first pad area PA1 and the second pad area PA2 may be connected to each other by the second connection member AM2. The thickness of the via-insulating layer 400 may be thicker than the total thickness of the conductive layers 200 and 300 in the thickness direction (i.e., the fourth direction DR4). Therefore, a contact area between the second connection member AM2, the first sub-display panel SDP1 and the second sub-display panel SDP2 may increase. Accordingly, the adhesive strength between the first sub-display panel SDP1 and the second sub-display panel SDP2 may be improved.

Figure 25:
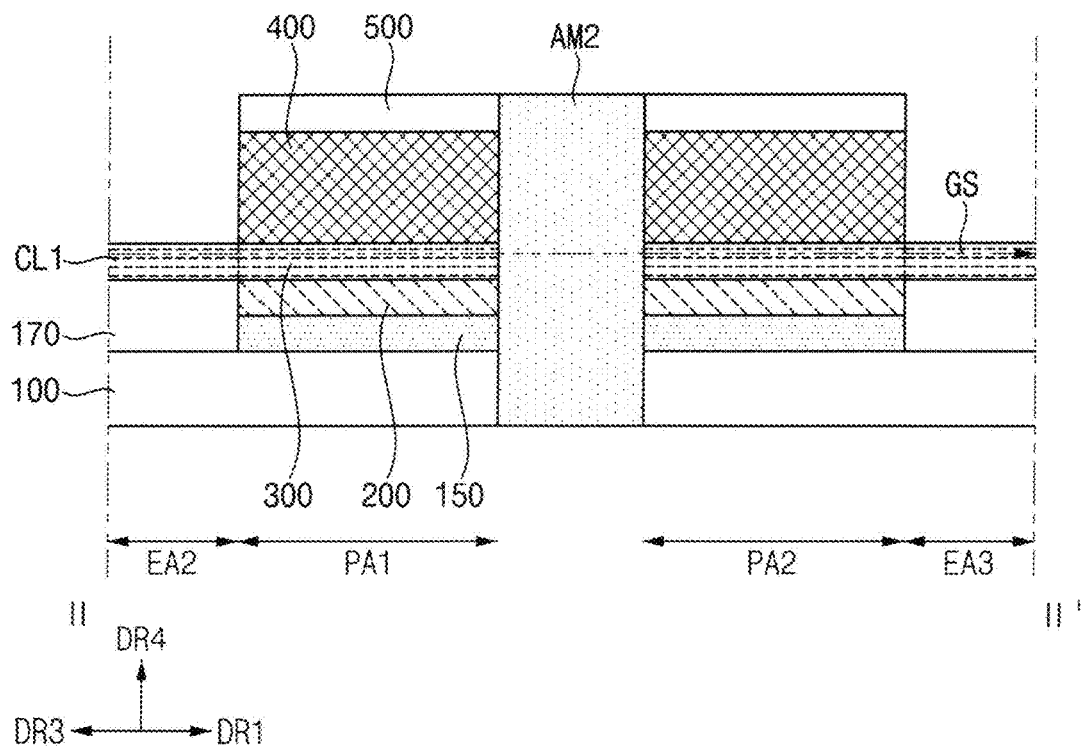
FIG. 25 is a sectional view showing another embodiment taken along line II-II' of FIG. 21.

FIG. 25 is a sectional view showing another embodiment taken along line II-II' of FIG. 21. FIG. 25 may be substantially the same as FIG. 24 except for the third conductive layer 150 and the second insulating layer 170. Accordingly, the description for duplicate components will be omitted.

Referring to FIGS. 2, 21 and 25, the third conductive layer 150 may be disposed on the substrate 100. The first conductive layer 200 may be disposed on the third conductive layer 150. The second conductive layer 300 may be disposed on the first conductive layer 200.

The second insulating layer 170 may be disposed on the substrate 100. The gate line CL1 may be disposed on the second insulating layer 170. The second insulating layer 170 may include an organic insulating material, an inorganic insulating material, or the like. For example, the second insulating layer 170 may include an organic insulating material. The second insulating layer 170 may have a structure in which the organic insulating material and the inorganic insulating material are laminated.

In the embodiments, when the first conductive layer 200 contacts with the second conductive layer 300 and the third conductive layer 150, the gate signal GS flowing through the gate line CL1 may be effectively transferred in the pad areas PA1 and PA2.

Although it has been described with reference to embodiments of the present invention, it will be apparent to a person having ordinary skill in the art that various modifications and variations can be made in the present invention without departing from the scope and field of the following appended claims.

The present invention may be applied to a display panel and a display device including the same. For example, the display panel may be applied to smartphones, tablets, laptops, and monitors.

Although it has been described with reference to embodiments of the present invention, it will be apparent to a person having ordinary skill in the art that various modifications and variations can be made in the present invention without departing from the scope and field of the following appended claims.

What is claimed is:

1. A display panel comprising:
a first sub-display panel;
a second sub-display panel adjacent to the first sub-display panel in a first direction; and
a connection member electrically connecting the first sub-display panel to the second sub-display panel, wherein
the first sub-display panel includes:
   a first pixel disposed in a first pixel area among the plurality of the pixel areas;
   a second pixel between and adjacent to the first pixel and the second sub-display panel, and disposed in a second pixel area among the plurality of the pixel areas;
   a first power voltage line for transferring a power voltage to the first pixel, extending in a second direction perpendicular to the first direction, and disposed in the first pixel area; and
   a first gate line electrically connected to the first pixel and the second pixel, the first gate line extending in the first direction,
the second pixel receives the power voltage from the first power voltage line,
the second sub-display panel includes a third pixel adjacent to the first sub-display panel, and
the third pixel is electrically connected to the first gate line,
wherein the third pixel is disposed only on one first side of the connection member, while the first and second pixels are disposed on only a second side of the connection member, which is opposite to the first side,
wherein the first sub-display panel further includes a first connection pad disposed between and adjacent to the second pixel and the second sub-display panel,
wherein the second sub-display panel further includes a second connection pad disposed between and adjacent to the third pixel and the first-sub display panel,
wherein the connection member includes a plurality of conductive balls overlapping the first connection pad and the second connection pad,
wherein the first connection pad is electrically connected to the first gate line, and
wherein the conductive balls electrically connect the first connection pad and the second connection pad.

2. The display panel of claim 1, wherein the first sub-display panel further includes a first power voltage transfer line, and the first power voltage transfer line is electrically connected to the first power voltage line through a contact hole.

3. The display panel of claim 2, wherein the first power voltage transfer line and the first power voltage line are perpendicular to each other.

4. The display panel of claim 2, wherein the second pixel receives the power voltage through the first power voltage transfer line.

5. The display panel of claim 2, wherein the first pixel further includes a plurality of power voltage connection lines, and each of the power voltage connection lines is electrically connected to the first power voltage transfer line through a contact hole.

6. The display panel of claim 5, wherein the power voltage connection lines are electrically connected to a cathode electrode of a light emitting device.

7. The display panel of claim 1, wherein the second sub-display panel further includes:
a fourth pixel adjacent to the third pixel and spaced apart from the first sub-display panel with the third pixel therebetween;
a second low power voltage line for applying the power voltage to the fourth pixel; and
a second gate line electrically connected to the first gate line, the third pixel, and the fourth pixel.

8. The display panel of claim 7, wherein the second sub-display panel further includes a second power voltage transfer line, the second power voltage transfer line is electrically connected to the second power voltage line through a contact hole, and the third pixel receives the power voltage through the second power voltage transfer line.

9. The display panel of claim 8, wherein the second power voltage transfer line and the second power voltage line are perpendicular to each other.

10. The display panel of claim 8, wherein the second pixel further includes a plurality of power voltage connection lines, and each of the power voltage connection lines is electrically connected to the second power voltage transfer line through a contact hole.

11. The display panel of claim 10, wherein the power voltage connection lines are electrically connected to a cathode electrode of a light emitting device.

12. The display panel of claim 1, wherein the first connection pad and the second connection pad are spaced apart from each other.

13. The display panel of claim 12, wherein the first connection pad and the second connection pad contact with the connection member.

14. The display panel of claim 13, wherein the second connection pad is electrically connected to a second gate line electrically connected to the third pixel.

15. The display panel of claim 14, wherein the first connection pad includes a conductive layer electrically connected to the first gate line, and the conductive layer has a thickness thicker than a thickness of the first gate line in a thickness direction.

16. The display panel of claim 15, wherein the first connection pad further includes a via-insulating layer, and the via-insulating layer has a thickness thicker than the thickness of the conductive layer.

17. The display panel of claim 14, wherein the second connection pad includes a conductive layer electrically connected to the second gate line, and the conductive layer has a thickness thicker than a thickness of the second gate line in a thickness direction.

18. The display panel of claim 17, wherein the second connection pad further includes a via-insulating layer, and the via-insulating layer has a thickness thicker than the thickness of the conductive layer.

19. The display panel of claim 1, wherein the connection member includes a conductive material.

20. The display panel of claim 1, wherein the connection member includes an anisotropic conductive film.

21. A display device comprising:
a gate driver; and
a display panel disposed on one side of the gate driver and electrically connected to the gate driver, wherein the display panel includes:
a first sub-display panel including a plurality of pixel areas;
a second sub-display panel adjacent to the first sub-display panel in a first direction; and
a connection member electrically connecting the first sub-display panel to the second sub-display panel, and the first sub-display panel includes:
a first pixel disposed in a first pixel area among the plurality of the pixel areas;
a second pixel between and adjacent to the first pixel and the second sub-display panel, and disposed in a second pixel area among the plurality of the pixel areas;
a first power voltage line for transferring a power voltage to the first pixel, extending in a second direction perpendicular to the first direction, and disposed in the first pixel area; and
a first gate line electrically connected to the gate driver, the first pixel, and the second pixel, the first gate line extending in the first direction, and wherein
the second pixel receives the power voltage from the first power voltage line,
the second sub-display panel includes a third pixel adjacent to the first sub-display panel, and
the third pixel is electrically connected to the first gate line,
wherein the third pixel is disposed only on one first side of the connection member, while the first and second pixels are disposed on only a second side of the connection member, which is opposite to the first side,
wherein the first sub-display panel further includes a first connection pad disposed between and adjacent to the second pixel and the second sub-display panel,
wherein the second sub-display panel further includes a second connection pad disposed between and adjacent to the third pixel and the first-sub display panel,
wherein the connection member includes a plurality of conductive balls overlapping the first connection pad and the second connection pad,
wherein the first connection pad is electrically connected to the first gate line, and
wherein the conductive balls electrically connect the first connection pad and the second connection pad.

22. The display device of claim 21, wherein the first sub-display panel further includes a first power voltage transfer line, and the first power voltage transfer line is electrically connected to the first power voltage line through a contact hole.

23. The display device of claim 22, wherein the first pixel further includes a plurality of power voltage connection lines, and each of the power voltage connection lines is electrically connected to the first power voltage transfer line through a contact hole.

24. The display device of claim 23, wherein the power voltage connection lines are electrically connected to a cathode electrode of a light emitting device.

25. The display device of claim 21, wherein the second sub-display panel further includes:
a fourth pixel adjacent to the third pixel and spaced apart from the first sub-display panel with the third pixel therebetween;
a second power voltage line for applying the power voltage to the fourth pixel; and
a second gate line electrically connected to the first gate line, the third pixel, and the fourth pixel.

26. The display device of claim 25, wherein the second sub-display panel further includes a second power voltage transfer line, the second power voltage transfer line is electrically connected to the second low power voltage line through a contact hole, and the third pixel receives the power voltage through the second power voltage transfer line.

27. The display device of claim 26, wherein the second pixel further includes a plurality of power voltage connection lines, and each of the power voltage connection lines is electrically connected to the second power voltage transfer line through a contact hole.

28. The display device of claim 27, wherein the power voltage connection lines are electrically connected to a cathode electrode of a light emitting device.

* * * * *